(12) United States Patent
Chen et al.

(10) Patent No.: US 11,121,041 B2
(45) Date of Patent: *Sep. 14, 2021

(54) METHODS FOR THRESHOLD VOLTAGE TUNING AND STRUCTURE FORMED THEREBY

(71) Applicant: Taiwan Semiconductor Manufacturing Co., Ltd., Hsinchu (TW)

(72) Inventors: Zoe Chen, Taipei (TW); Ching-Hwanq Su, Tainan (TW); Cheng-Lung Hung, Hsinchu (TW); Cheng-Yen Tsai, New Taipei (TW); Da-Yuan Lee, Jhubei (TW); Hsin-Yi Lee, Hsinchu (TW); Weng Chang, Hsinchu (TW); Wei-Chin Lee, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 7 days.

This patent is subject to a terminal disclaimer.

(21) Appl. No.: 16/684,765

(22) Filed: Nov. 15, 2019

(65) Prior Publication Data
US 2020/0083114 A1    Mar. 12, 2020

Related U.S. Application Data

(63) Continuation of application No. 15/952,534, filed on Apr. 13, 2018, now Pat. No. 10,510,621.

(51) Int. Cl.
*H01L 21/8238* (2006.01)
*H01L 27/092* (2006.01)
*H01L 29/10* (2006.01)

(52) U.S. Cl.
CPC ........... *H01L 21/823857* (2013.01); *H01L 21/823821* (2013.01); *H01L 27/0924* (2013.01); *H01L 29/1033* (2013.01); *H01L 29/1079* (2013.01)

(58) Field of Classification Search
CPC ..... H01L 21/823857; H01L 21/823821; H01L 27/0924; H01L 29/1033; H01L 29/1079
USPC .......................................... 257/392
See application file for complete search history.

(56) References Cited

U.S. PATENT DOCUMENTS

| 9,748,145 | B1 | 8/2017 | Kannan et al. |
| 10,510,621 | B2 * | 12/2019 | Chen ............ H01L 29/66795 |
| 2010/0320545 | A1 | 12/2010 | Jagannathan et al. |
| 2012/0108017 | A1 * | 5/2012 | Greene ............ H01L 27/088 438/154 |
| 2015/0021699 | A1 * | 1/2015 | Ando .............. H01L 21/845 257/368 |

(Continued)

FOREIGN PATENT DOCUMENTS

TW    201739051 A    11/2017

*Primary Examiner* — Tong-Ho Kim
(74) *Attorney, Agent, or Firm* — Slater Matsil, LLP

(57) ABSTRACT

Generally, the present disclosure provides example embodiments relating to tuning threshold voltages in transistor devices and the transistor devices formed thereby. Various examples implementing various mechanisms for tuning threshold voltages are described. In an example method, a gate dielectric layer is deposited over an active area in a device region of a substrate. A dipole layer is deposited over the gate dielectric layer in the device region. A dipole dopant species is diffused from the dipole layer into the gate dielectric layer in the device region.

20 Claims, 15 Drawing Sheets

(56) References Cited

U.S. PATENT DOCUMENTS

2017/0133486 A1      5/2017   Zhou
2017/0250117 A1      8/2017   Kannan et al.
2018/0261515 A1*     9/2018   Wang .................. H01L 29/0649

* cited by examiner

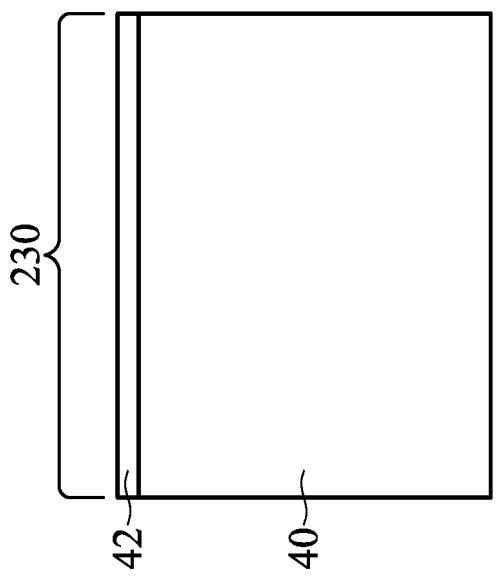
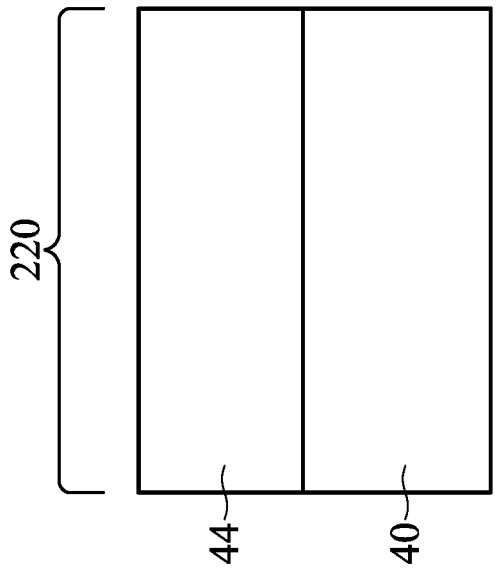
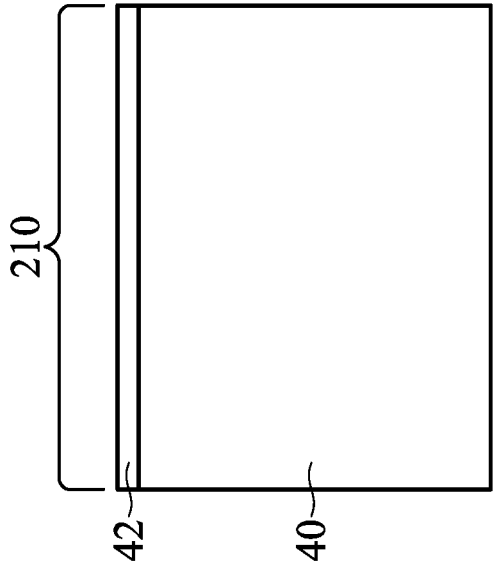
FIG. 1
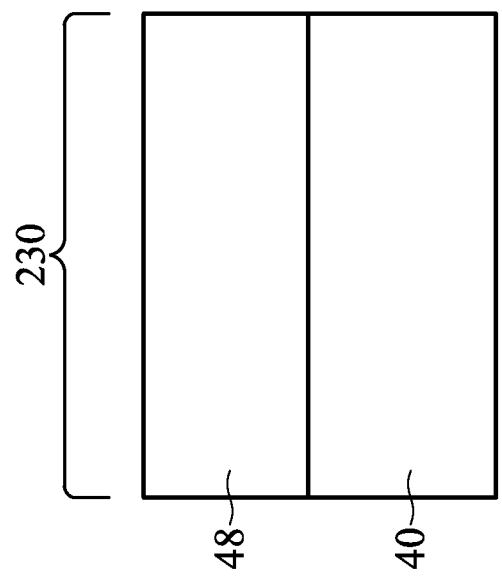
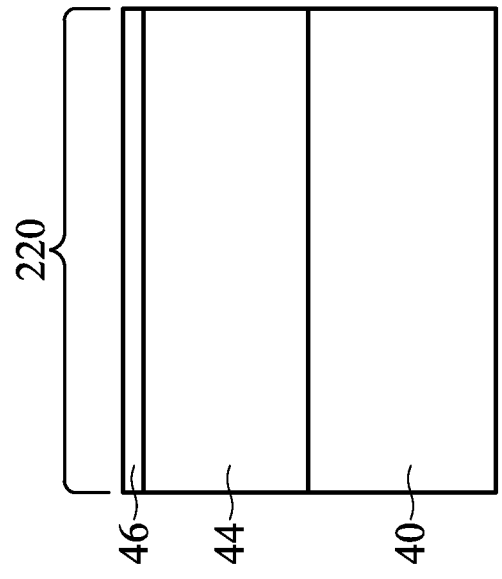
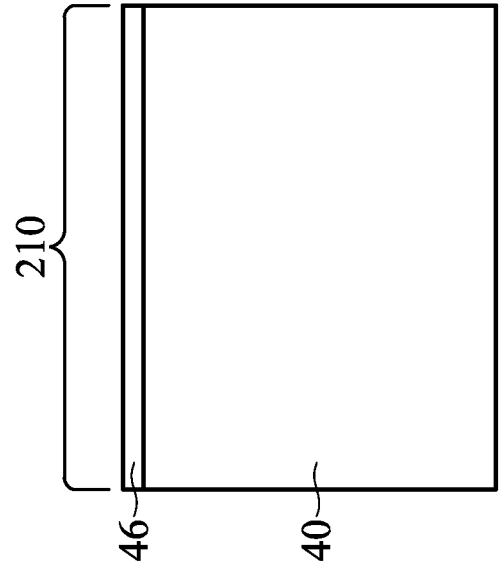
FIG. 2

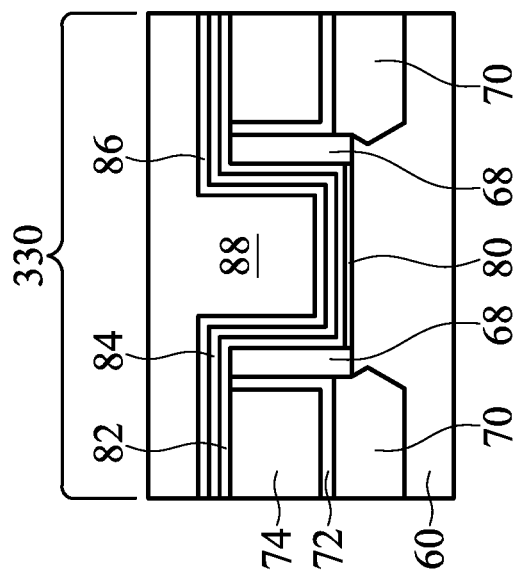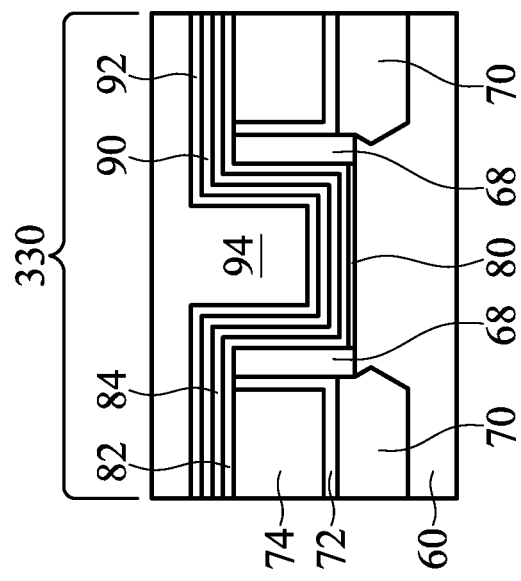
FIG. 10
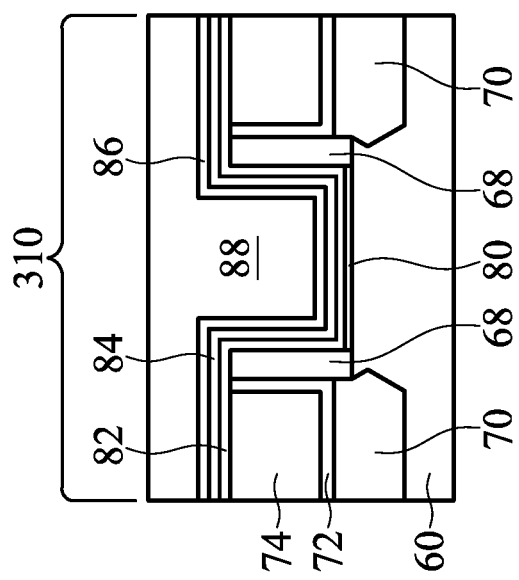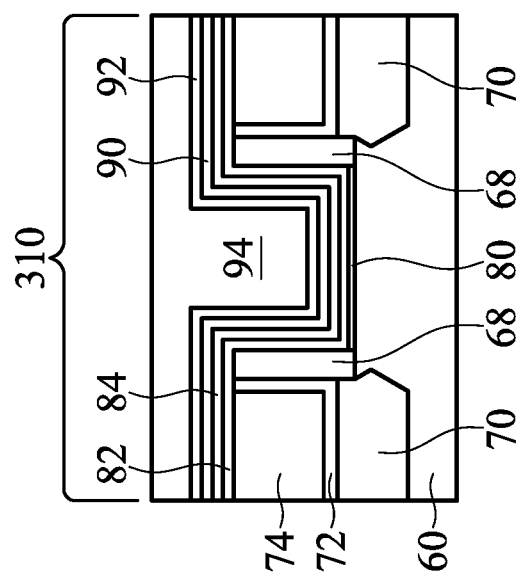
FIG. 11

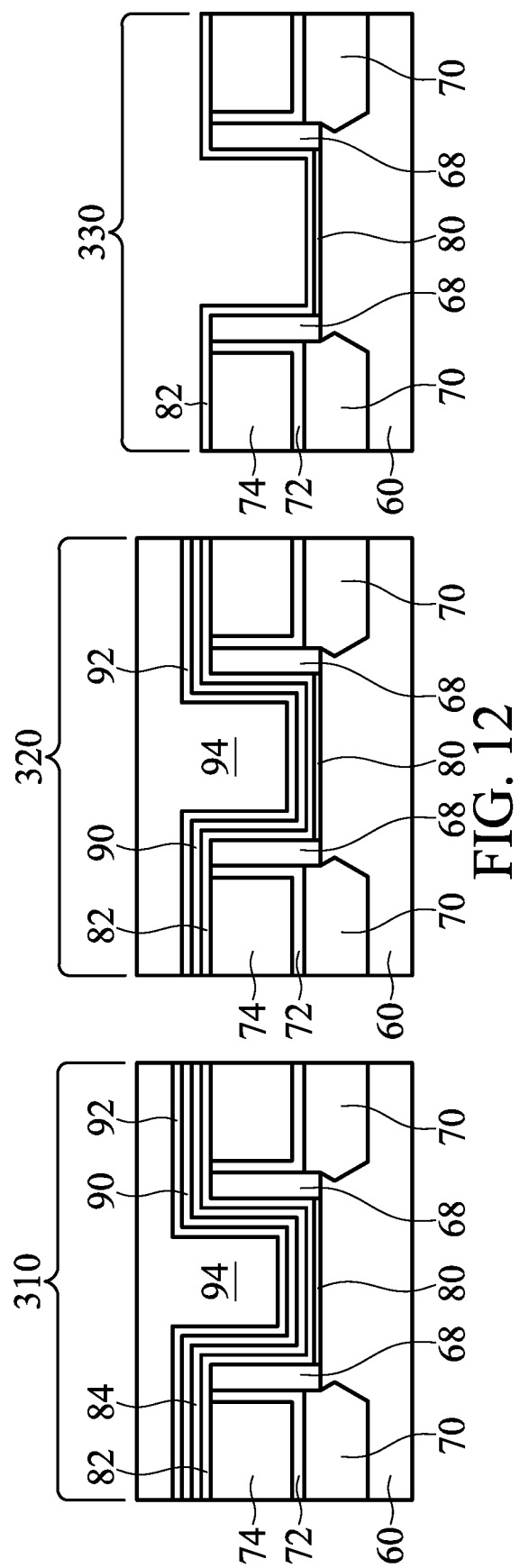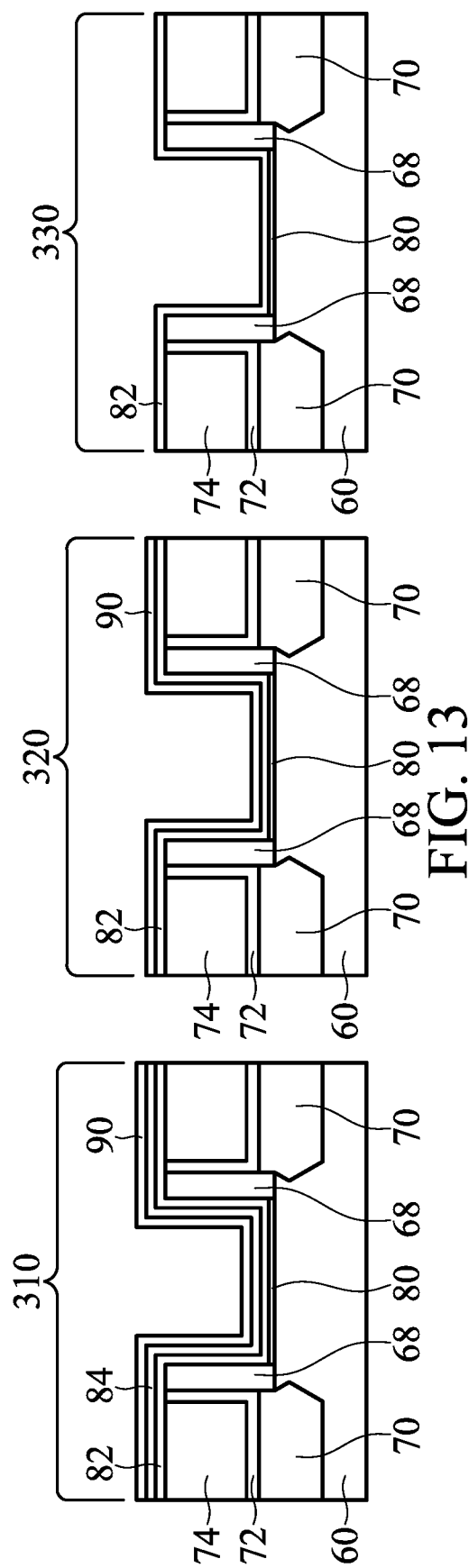
FIG. 12
FIG. 13

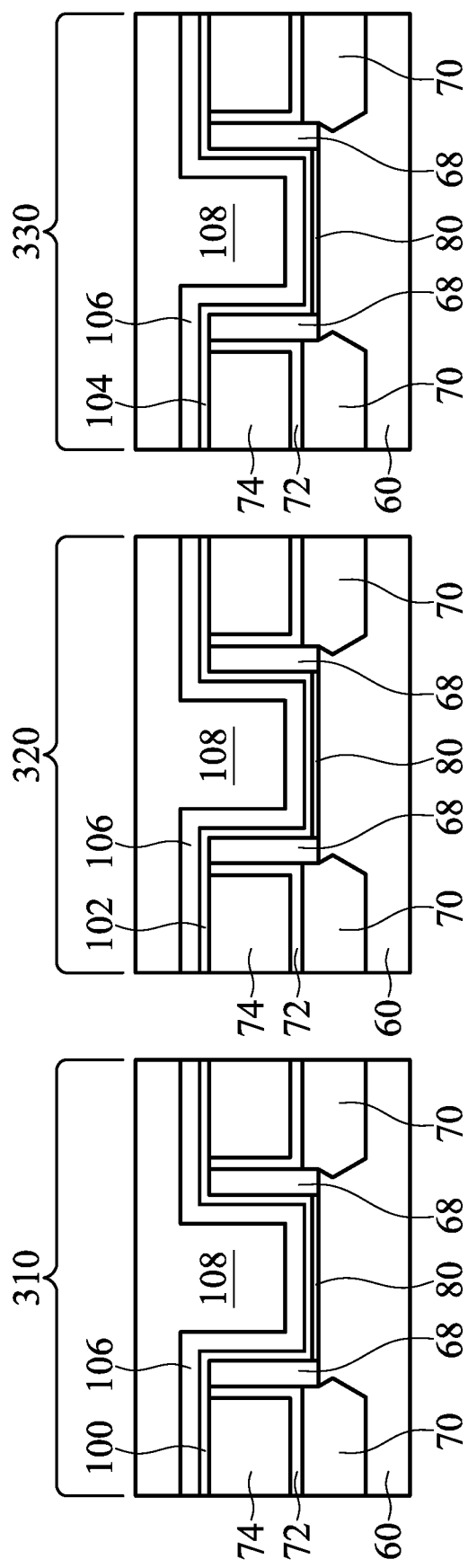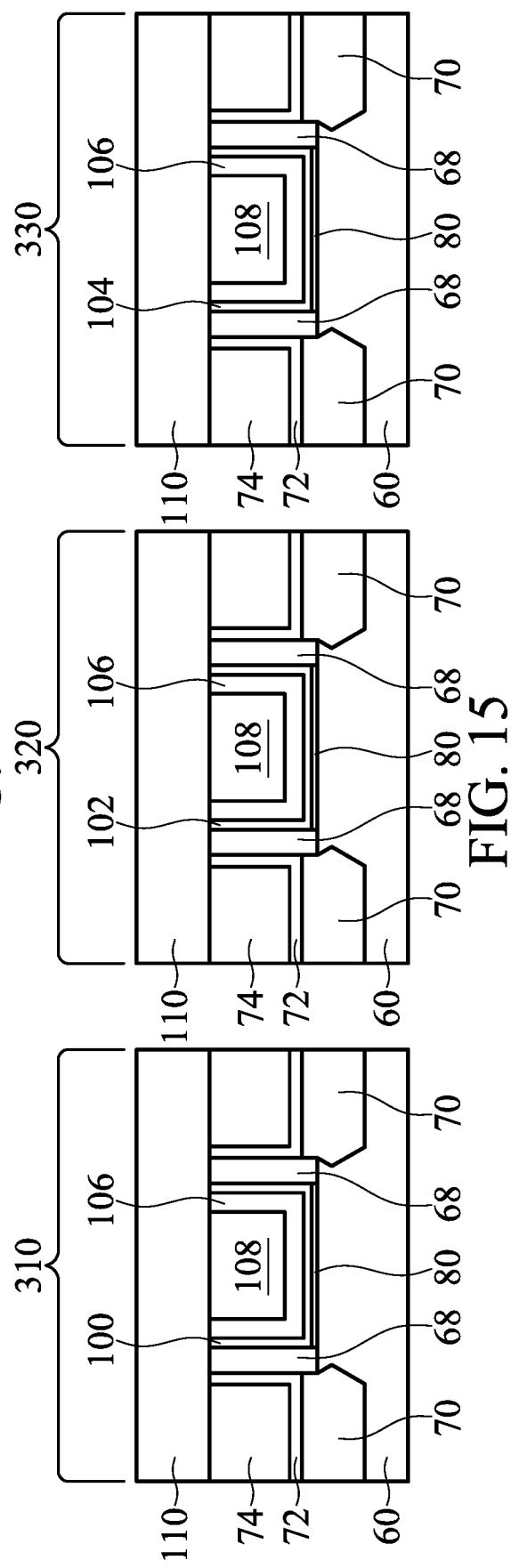

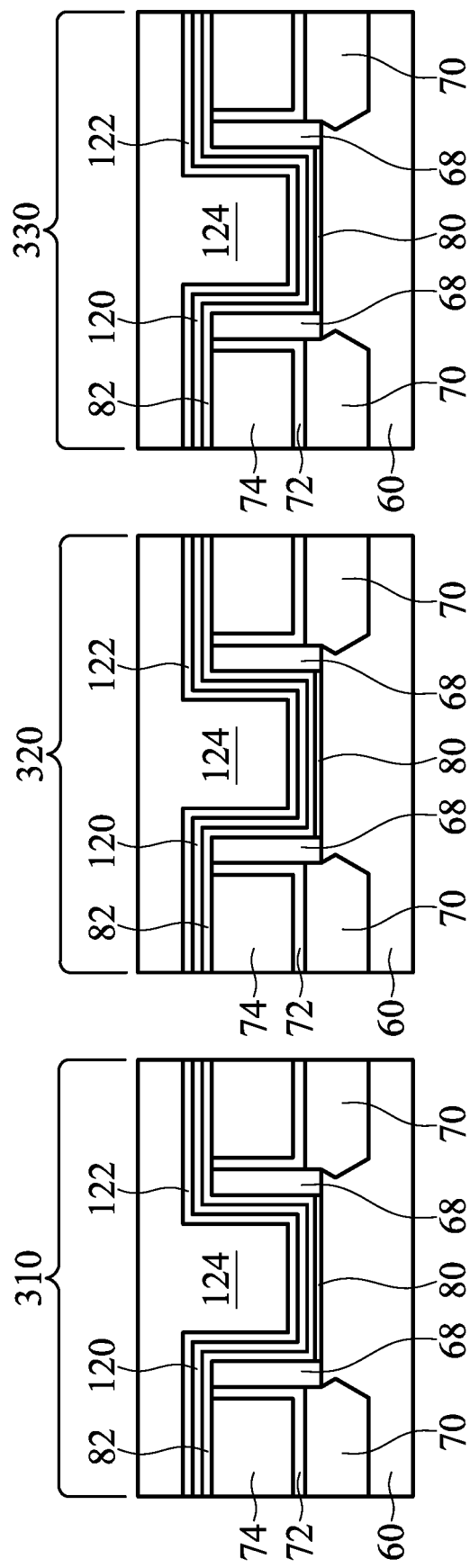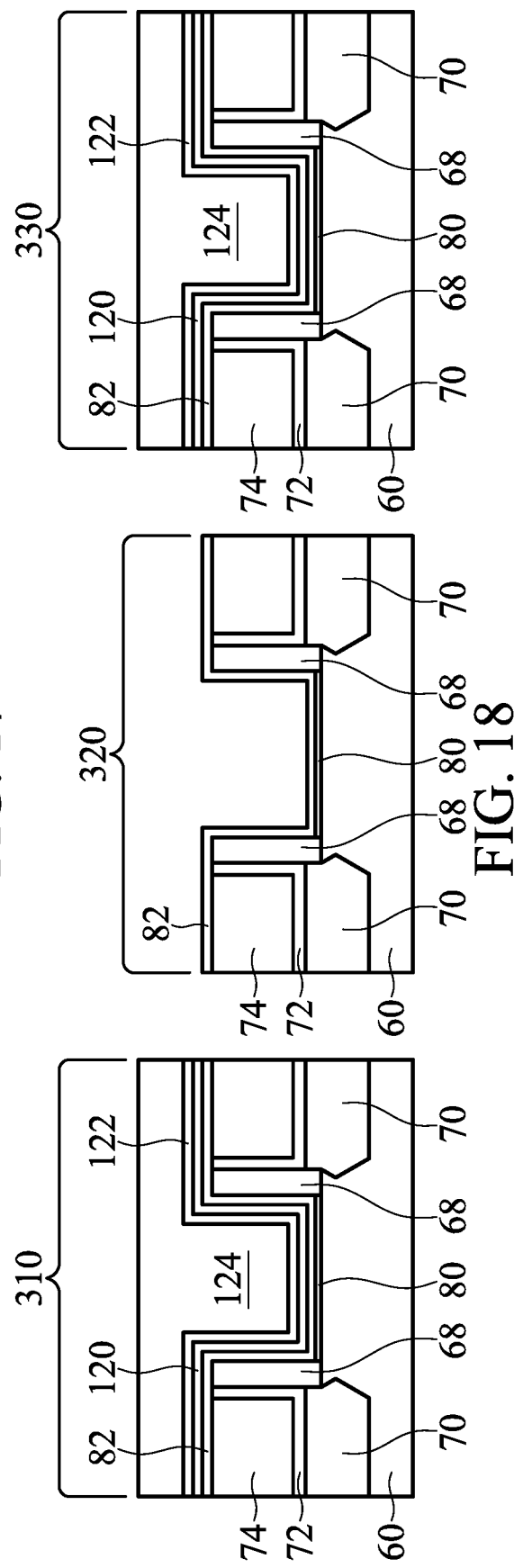
FIG. 17
FIG. 18

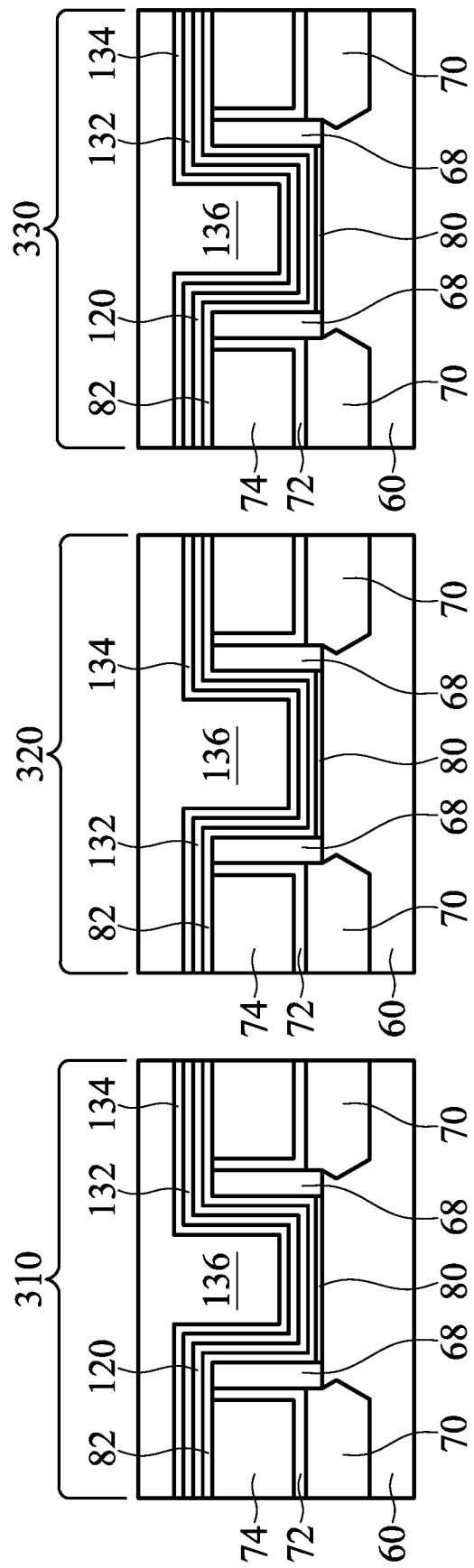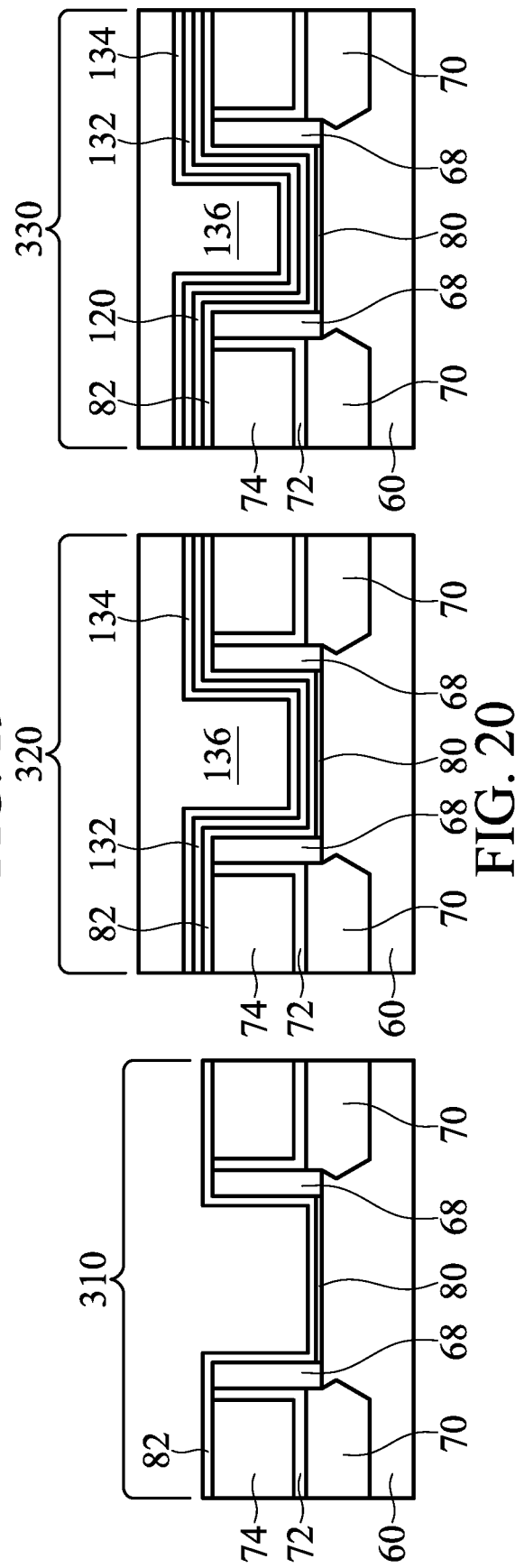

METHODS FOR THRESHOLD VOLTAGE TUNING AND STRUCTURE FORMED THEREBY

This application is a continuation of U.S. patent application Ser. No. 15/952,534 filed on Apr. 13, 2018, now U.S. Pat. No. 10,510,621, entitled "Methods for Threshold Voltage Tuning and Structures Formed Thereby," which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 4 are cross-sectional views of intermediate structures at respective stages during an example method for forming a semiconductor device in accordance with some embodiments.

FIGS. 6 through 15 are cross-sectional views of intermediate structures at respective stages during an example method for forming a semiconductor device in accordance with some embodiments.

FIGS. 17 through 23 are cross-sectional views of intermediate structures at respective stages during another example method for forming a semiconductor device in accordance with some embodiments.

DETAILED DESCRIPTION

Figure 3:
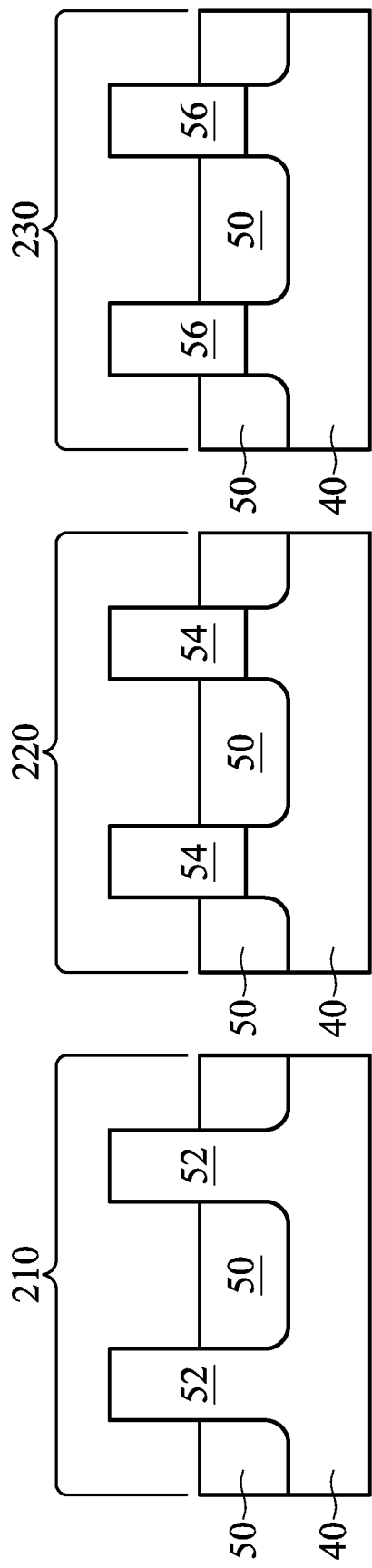

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to tuning threshold voltages in transistor devices and the transistor devices formed thereby. More specifically, in some examples, gate dielectric layers for different transistor devices on a substrate can be formed by depositing the gate dielectric layer and subsequently diffusing one or more dipole dopant species into the gate dielectric layer. A dipole dopant concentration of the one or more dipole dopant species in the gate dielectric layer for one transistor device can be different from a dipole dopant concentration of the one or more dipole dopant species in the gate dielectric layer for another transistor device to tune the threshold voltages of those transistor devices differently. Further in some examples, channel regions of different transistor devices can have different materials and/or different conductivity dopant concentrations to tune the threshold voltages of those transistor devices differently. These aspects can be implemented to tune threshold voltages of transistor devices without affecting respective spacings for the gates of the transistor devices. These aspects can further be implemented in various combinations and with or without additional work-function tuning layers in the gates to tune threshold voltages. Using these aspects, multiple different threshold voltages can be achieved in different transistor devices on a substrate.

Examples described herein are described in the context of forming Fin Field Effect Transistors (FinFETs). Other examples can be implement in forming other transistor devices (e.g., that include a metal-oxide-semiconductor (MOS) structure), such as planar Field Effect Transistors (FETs), Vertical Gate All Around (VGAA) FETs, Horizontal Gate All Around (HGAA) FETs, tunnel FETs, etc. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. Further, details of some processes that would be apparent and readily understood by a person having ordinary skill in the art may be omitted herein for brevity. For example, a person having ordinary skill in the art would readily understand details of some photolithography processes, etching processes, and deposition processes implemented herein, and hence, such details are omitted herein.

FIGS. 1 through 4 illustrate cross-sectional views of intermediate structures at respective stages during an example method for forming a semiconductor device in accordance with some embodiments. More specifically, FIGS. 1 through 4 illustrate a method for forming fins in different device regions, where the fins of the different device regions can include different material compositions and/or conductivity dopant concentrations in channel regions of the fins. By implementing different material compositions and/or conductivity dopant concentrations in the fins of the different device regions, the threshold voltages of the transistor devices in the respective device regions can be tuned. The fins formed according to the method of FIGS. 1 through 4 can be implemented with any of the methods and/or structures described below to further tune threshold voltages of FinFETs, for example.

FIG. 1 illustrates the formation of a first material/dopant region 44 on a semiconductor substrate 40. The semiconductor substrate 40 includes a first device region 210, a second device region 220, and a third device region 230. The semiconductor substrate 40 may be or include a bulk semiconductor, a semiconductor-on-insulator (SOI) substrate, or the like, which may be doped with a conductivity dopant species (e.g., a p-type or an n-type dopant species) or undoped. In some embodiments, the semiconductor material of the semiconductor substrate 40 may include an elemental semiconductor such as silicon (Si) and/or germanium (Ge); a compound semiconductor; an alloy semiconductor; or a combination thereof.

A mask 42 is formed on the semiconductor substrate 40 to expose the semiconductor substrate 40 in the second device region 220 while covering the semiconductor substrate 40 in the first device region 210 and the third device region 230. The mask 42 may include a hardmask, which may be or include titanium oxide, silicon nitride, silicon oxynitride, silicon carbon nitride, the like, or a combination thereof. The mask 42 may be deposited on the semiconductor substrate 40 across the device regions 210, 220, 230 by an appropriate deposition process and subsequently patterned, such as by appropriate photolithography and etching processes, to expose the semiconductor substrate 40 in the second device region 220.

With the mask 42 patterned to expose the semiconductor substrate 40 in the second device region 220, the first material/dopant region 44 is formed on and/or in the semiconductor substrate 40 in the second device region 220. In some examples, the first material/dopant region 44 includes a first conductivity dopant species at a first conductivity dopant concentration and/or a first epitaxial material. In some examples, the first conductivity dopant species can be implanted, such as by using ion implantation, plasma doping, or the like, into the semiconductor substrate 40 to form the first material/dopant region 44. In some examples, the semiconductor substrate 40 can be etched in the second device region 220, and the first epitaxial material can be grown, such as by an appropriate epitaxy deposition process, on the semiconductor substrate 40 in the second device region 220. In some examples, the first epitaxial material can be in situ doped during epitaxial growth with the first conductivity dopant species and/or implanted with the first conductivity dopant species after epitaxial growth. Following the formation of the first material/dopant region 44, the mask 42 is removed, such as by a planarization process, like a chemical mechanical planarization (CMP), which may further planarize top surfaces of the semiconductor substrate 40 in the first device region 210 and third device region 230 and a top surface of the first material/dopant region 44 in the second device region 220.

FIG. 2 illustrates the formation of a second material/dopant region 48 in the third device region 230 of the semiconductor substrate 40. A mask 46 is formed on the semiconductor substrate 40 to expose the semiconductor substrate 40 in the third device region 230 while covering the semiconductor substrate 40 in the first device region 210 and the second device region 220. The mask 46 may include a hardmask, which may be or include titanium oxide, silicon nitride, silicon oxynitride, silicon carbon nitride, the like, or a combination thereof. The mask 46 may be deposited on the semiconductor substrate 40 across the device regions 210, 220, 230 by an appropriate deposition process and subsequently patterned, such as by appropriate photolithography and etching processes, to expose the semiconductor substrate 40 in the third device region 230.

With the mask 46 patterned to expose the semiconductor substrate 40 in the third device region 230, the second material/dopant region 48 is formed on and/or in the semiconductor substrate 40 in the third device region 230. In some examples, the second material/dopant region 48 includes a second conductivity dopant species at a second conductivity dopant concentration and/or a second epitaxial material. In some examples, the second conductivity dopant species can be implanted, such as by using ion implantation, plasma doping, or the like, into the semiconductor substrate 40 to form the second material/dopant region 48. In some examples, the semiconductor substrate 40 can be etched in the third device region 230, and the second epitaxial material can be grown, such as by an appropriate epitaxy deposition process, on the semiconductor substrate 40 in the third device region 230. In some examples, the second epitaxial material can be in situ doped during epitaxial growth with the second conductivity dopant species and/or implanted with the second conductivity dopant species after epitaxial growth. Following the formation of the second material/dopant region 48, the mask 46 is removed, such as by a planarization process, like a CMP, which may further planarize top surfaces of the semiconductor substrate 40 in the first device region 210, the first material/dopant region 44 in the second device region 220, and the second material/dopant region 48 in the third device region 230.

FIG. 3 illustrates the formation of fins 52, 54, 56 and isolation regions 50 on the semiconductor substrate 40. The semiconductor substrate 40, first material/dopant region 44, and second material/dopant region 48 are etched such that trenches are formed between neighboring pairs of fins 52, 54, 56 and such that the fins 52, 54, 56 protrude from the semiconductor substrate 40. The etching process may be any appropriate anisotropic etching process, for example. The trenches in the first device region 210 extend in the semiconductor substrate 40 to form the fins 52 in the first device region 210. The trenches in the second device region 220 extend through the first material/dopant region 44 and into the semiconductor substrate 40 to form the fins 54 in the second device region 220. The trenches in the third device region 230 extend through the second material/dopant region 48 and into the semiconductor substrate 40 to form the fins 56 in the third device region 230.

An insulating material is deposited, by any appropriate deposition process, in the trenches. The insulating material may include or be an oxide (such as silicon oxide), a nitride, the like, or a combination thereof. A planarization process, such as a CMP, may remove any excess insulating material to form top surfaces of the insulating material and the fins 52, 54, 56 to be coplanar. The insulating material is then recessed to form the isolation regions 50. The insulating material is recessed such that the fins 52, 54, 56 protrude from between neighboring isolation regions 50, which may, at least in part, thereby delineate the fins 52, 54, 56 as active areas on the semiconductor substrate 40. The insulating material may be recessed using an acceptable etching process, such as one that is selective to the material of the insulating material. Top surfaces of the isolation regions 50 in the second device region 220 may be at a level above an interface between the first material/dopant region 44 and the semiconductor substrate 40, and top surfaces of the isolation regions 50 in the third device region 230 may be at a level above an interface between the second material/dopant region 48 and the semiconductor substrate 40. The materials of the fins 52, 54, 56 (e.g., the semiconductor substrate 40, first material/dopant region 44, and second material/dopant region 48, respectively) subsequently form respective channel regions over which replacement gate structures will be formed.

A person having ordinary skill in the art will readily understand that the processes described with respect to FIGS. 1 through 4 are just examples of how fins 52, 54, 56 may be formed. Other processes may be implemented to form the fins 52, 54, 56 on the semiconductor substrate 40.

Various examples will be described here to further illustrate aspects of FIGS. 1 through 4. The examples described here are in the context of fins 52, 54, 56 being implemented in p-type FinFETs. A person having ordinary skill in the art will readily understand corresponding examples for the fins 52, 54, 56 to be implemented in n-type FinFETs.

In a first example, the semiconductor substrate 40 is silicon, and the fins 52 are formed in, e.g., an n-type doped well in the silicon, where the n-type doped well has a first conductivity dopant concentration of the n-type dopant species. Hence, the fins 52 are silicon doped with the n-type dopant species at the first conductivity dopant concentration. The first material/dopant region 44 is silicon doped with the n-type dopant species at a second conductivity dopant concentration, and hence, the fins 54 are silicon doped with the n-type dopant species at the second conductivity dopant concentration. The second material/dopant region 48 is silicon doped with the n-type dopant species at a third conductivity dopant concentration, and hence, the fins 56 are silicon doped with the n-type dopant species at the third conductivity dopant concentration. The first material/dopant region 44 and second material/dopant region 48 can each be formed by implanting the n-type dopant species, e.g., by ion implantation or plasma doping, into the semiconductor substrate 40 at the second conductivity dopant concentration and third conductivity dopant concentration, respectively. The third conductivity dopant concentration can be greater than the second conductivity dopant concentration, which can be greater than the first conductivity dopant concentration.

In a second example, the semiconductor substrate 40 is silicon, and hence, the fins 52 are silicon. The first material/dopant region 44 is silicon germanium ($Si_{1-x}Ge_x$), and hence, the fins 54 are silicon germanium ($Si_{1-x}Ge_x$). The second material/dopant region 48 is silicon germanium ($Si_{1-y}Ge_y$), and hence, the fins 56 are silicon germanium ($Si_{1-y}Ge_y$). The first material/dopant region 44 and second material/dopant region 48 can each be formed by recessing the semiconductor substrate 40 and epitaxially growing the silicon germanium where the semiconductor substrate 40 was recessed. The semiconductor substrate 40, the first material/dopant region 44, and the second material/dopant region 48 can be doped with an n-type dopant species, e.g., by ion implantation, plasma doping, and/or in situ during epitaxial growth, at a same conductivity dopant concentration. The concentration of germanium in the second material/dopant region 48 (e.g., y) can be greater than the concentration of germanium in the first material/dopant region 44 (e.g., x), which can be greater than the than the concentration of germanium in the semiconductor substrate 40.

In a third example, the semiconductor substrate 40 is silicon, and the fins 52 are formed in, e.g., an n-type doped well in the silicon, where the n-type doped well has a first conductivity dopant concentration of the n-type dopant species. Hence, the fins 52 are silicon doped with the n-type dopant species at the first conductivity dopant concentration. The first material/dopant region 44 is silicon germanium ($Si_{1-x}Ge_x$) doped with the n-type dopant species at a second conductivity dopant concentration, and hence, the fins 54 are silicon germanium ($Si_{1-x}Ge_x$) doped with the n-type dopant species at the second conductivity dopant concentration. The second material/dopant region 48 is silicon germanium ($Si_{1-y}Ge_y$) doped with the n-type dopant species at a third conductivity dopant concentration, and hence, the fins 56 are silicon germanium ($Si_{1-y}Ge_y$) doped with the n-type dopant species at the third conductivity dopant concentration. The first material/dopant region 44 and second material/dopant region 48 can each be formed by recessing the semiconductor substrate 40 and epitaxially growing the silicon germanium where the semiconductor substrate 40 was recessed while in situ doping with the n-type dopant species at the second conductivity dopant concentration and third conductivity dopant concentration, respectively. The third conductivity dopant concentration can be greater than the second conductivity dopant concentration, which can be greater than the first conductivity dopant concentration. The concentration of germanium in the second material/dopant region 48 (e.g., y) can be greater than the concentration of germanium in the first material/dopant region 44 (e.g., x), which can be greater than the than the concentration of germanium in the semiconductor substrate 40.

Generally, forming fins 52, 54, 56 with different materials and/or conductivity dopant concentrations (e.g., for same conductivity type transistor devices) according to methods described above can alter or tune the work-functions and/or capacitances between the gate and the fin across the gate dielectric layers in the transistor devices that are to be formed. The altered or tuned work-functions and/or capacitances can therefore alter or tune threshold voltages of the transistor devices formed in the device regions because threshold voltage is a function of the work-function and capacitance. Hence, by varying materials and/or conductivity dopant concentrations for different transistor devices, the different transistor devices can have different threshold voltages.

Figure 4:
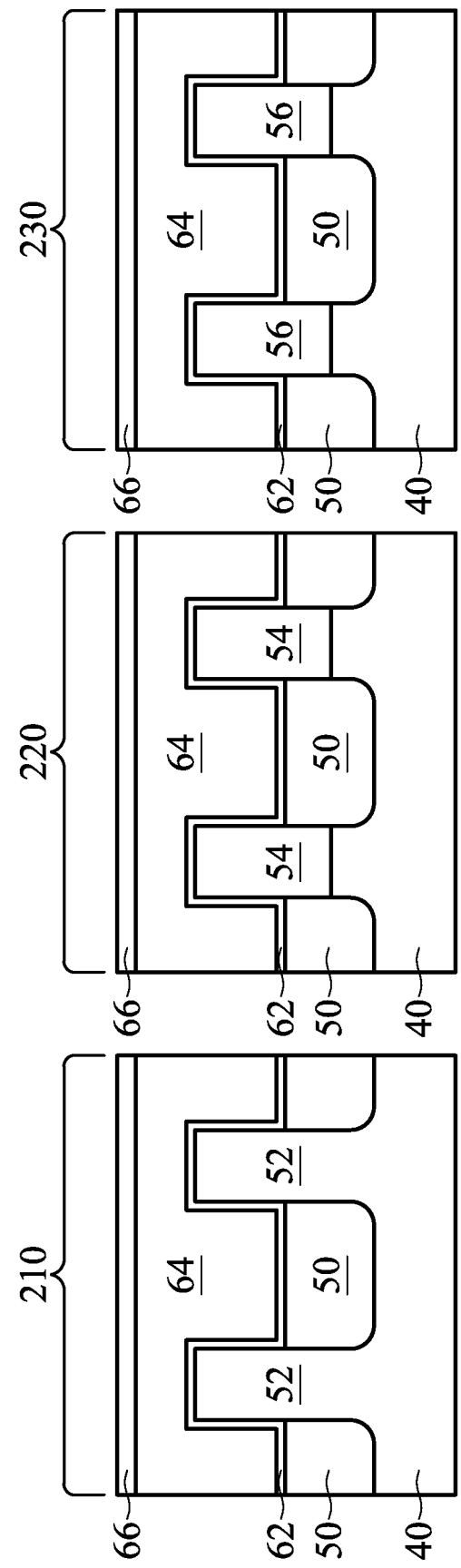

FIG. 4 illustrates the formation of dummy gate stacks, or more generally, dummy gate structures, on the fins 52, 54, 56. The respective dummy gate stacks are over and extend laterally perpendicularly to the fins 52, 54, 56. Each dummy gate stack comprises an interfacial dielectric 62, a dummy gate 64, and a mask 66. The interfacial dielectrics 62 may include or be silicon oxide, silicon nitride, the like, or multilayers thereof. The dummy gates 64 may include or be silicon (e.g., polysilicon) or another material. The masks 66 may include or be silicon nitride, silicon oxynitride, silicon carbon nitride, the like, or a combination thereof. The interfacial dielectrics 62, dummy gates 64, and masks 66 for the dummy gate stacks may be formed by sequentially forming or depositing respective layers, such as by appropriate deposition processes, and then patterning, such as by appropriate photolithography and etching processes, those layers into the dummy gate stacks.

Figure 5:
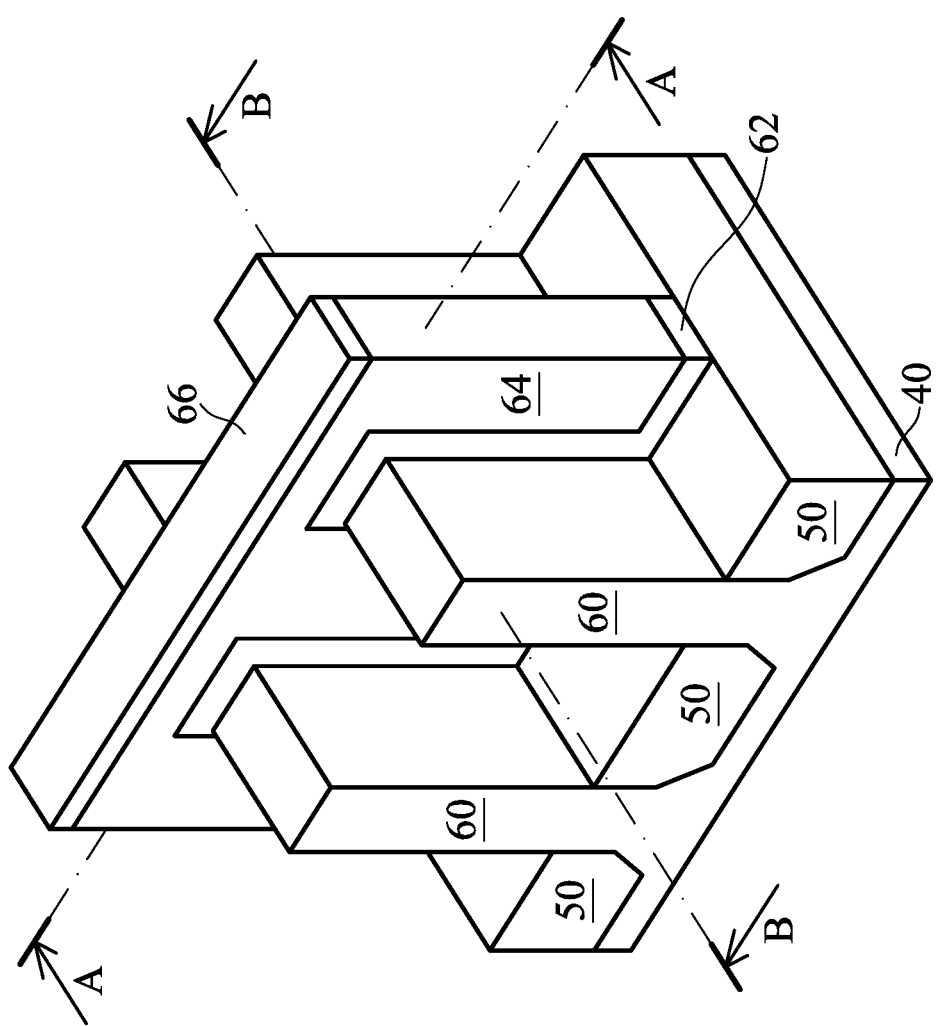
FIG. 5 is a perspective view of an intermediate structure at a respective stage during an example method for forming a semiconductor device in accordance with some embodiments.

FIG. 5 is a perspective view of an intermediate structure at a respective stage during an example method for forming a semiconductor device in accordance with some embodiments. The structure of FIG. 5 generally depicts fins 60 with a dummy gate stack formed in a device region of the semiconductor substrate 40. The fins 60 can be any of the fins 52 in the first device region 210, fins 54 in the second device region 220, and fins 56 in the third device region 230. As illustrated in FIG. 5, the dummy gate stack (including the interfacial dielectric 62, dummy gate 64, and mask 66) extends perpendicularly to the fins 60. Source/drain regions of the respective fins 60 are disposed in the fins 60 on opposing sides of the dummy gate stack. A channel region is in each fin 60 underlying the dummy gate stack and between source/drain regions.

FIG. 5 further illustrates reference cross-sections A-A and B-B. Cross-section A-A is in a plane along the dummy gate stack and across channel regions in the fins 60. Cross-section B-B is in a plane along a fin 60 across the opposing source/drain regions of the fin 60. Cross-section A-A is perpendicular to cross-section B-B. FIGS. 1 through 4 generally correspond with cross-section A-A, while subsequent figures generally correspond with cross-section B-B.

Figure 16:
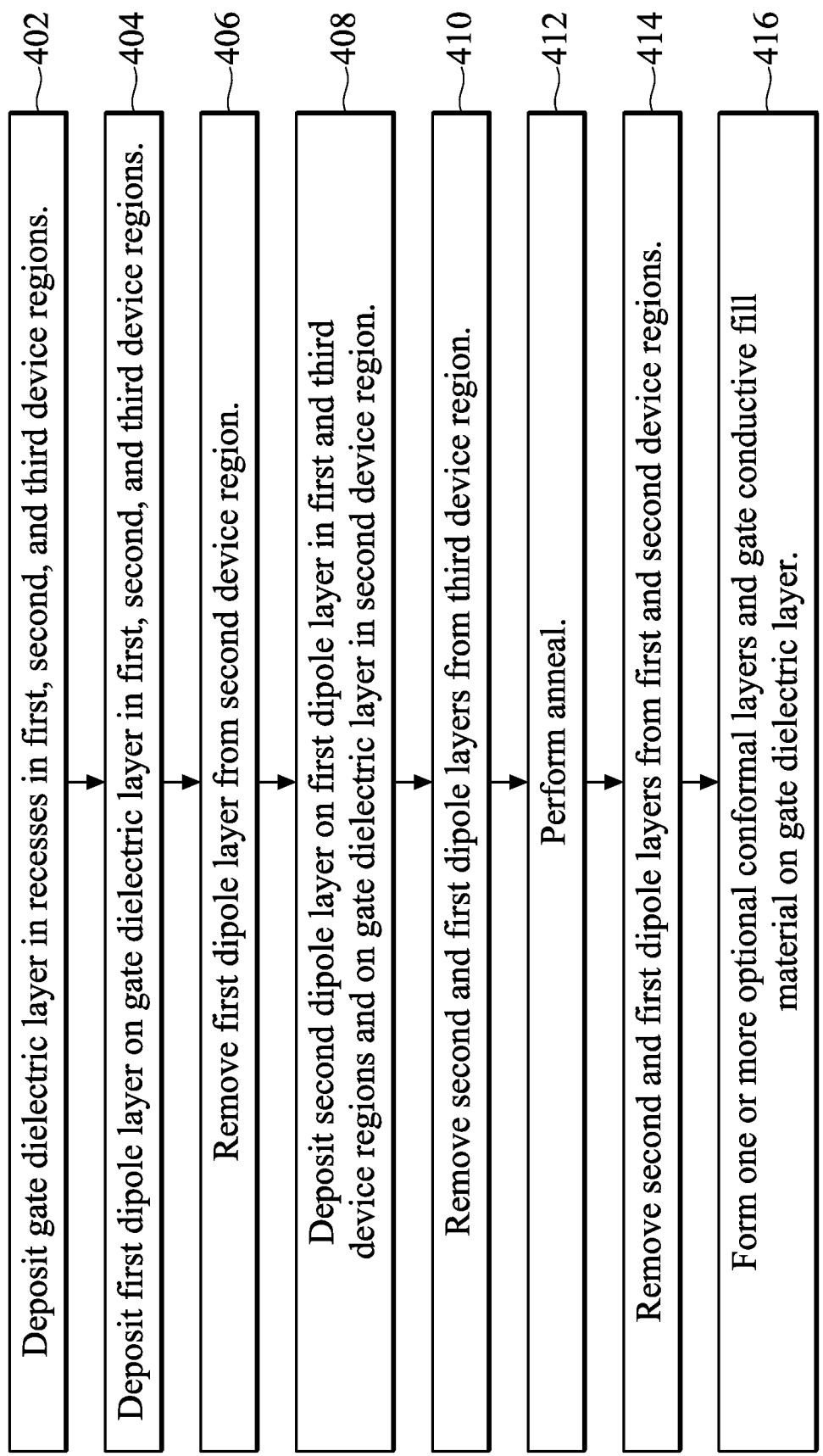
FIG. 16 is a flow chart of some operations of the example method for forming a semiconductor device in FIGS. 6 through 15 in accordance with some embodiments.

FIGS. 6 through 15 illustrate cross-sectional views of intermediate structures at respective stages during an example method for forming a semiconductor device in accordance with some embodiments. More specifically, FIGS. 6 through 15 illustrate a method for forming replacement gate structures in different device regions, where the replacement gate structures of the different device regions can include gate dielectric layers having varying levels of a dipole dopant species to tune threshold voltages, for example. FIG. 16 is a flow chart of some operations of the example method for forming a semiconductor device in FIGS. 6 through 15 in accordance with some embodiments.

The following figures illustrate a first device region 310, a second device region 320, and a third device region 330, each with a fin 60. These device regions 310, 320, 330 may be any of the first device region 210, second device region 220, and third device region 230 in FIGS. 1 through 4 in any combination, or another device region. For example, each of the device regions 310, 320, 330 may be the first device region 210, with the fins 60 each being a fin 52, or the device regions 310, 320, 330 may be the device regions 210, 220, 230, respectively. Any combination of these can be implemented to tune threshold voltages across the device regions 310, 320, 330.

Figure 6:
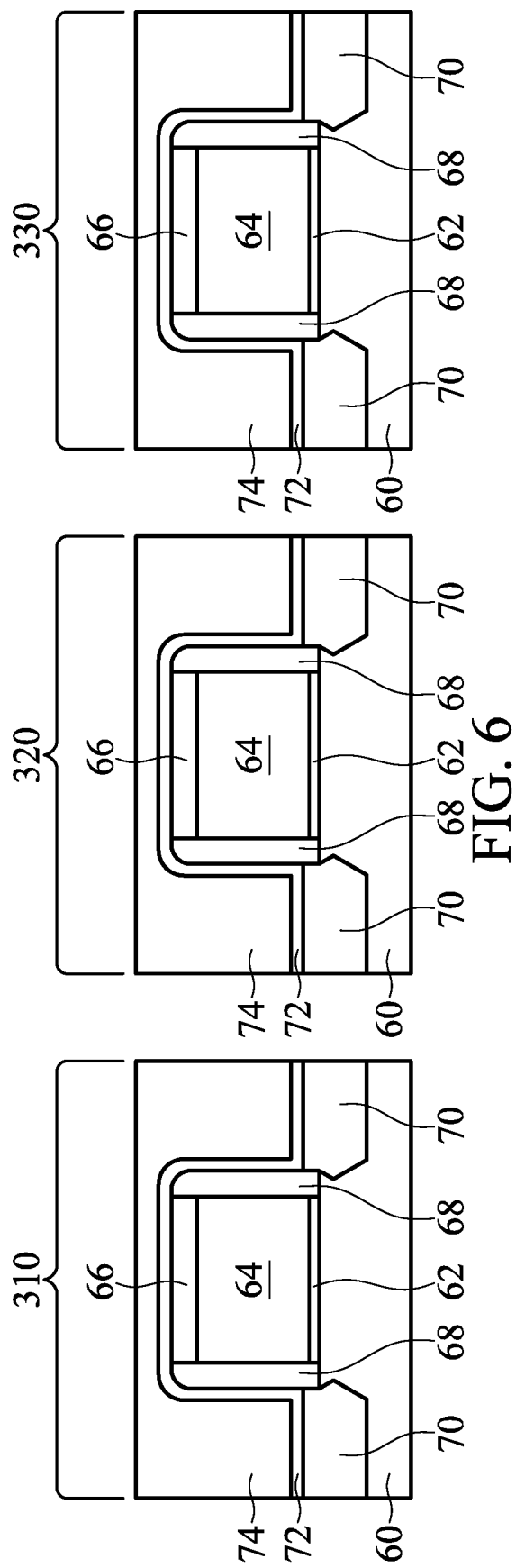

FIG. 6 illustrates the formation of gate spacers 68 along sidewalls of dummy gate stacks; source/drain regions 70 in the fins 60; a contact etch stop layer (CESL) 72 over the source/drain regions 70, gate spacers 68, and dummy gate stacks; and a first interlayer dielectric (ILD) 74 over the CESL 72. Gate spacers 68 are formed along sidewalls of the dummy gate stack (e.g., sidewalls of the interfacial dielectric 62, dummy gate 64, and mask 66) and over the fins 60 on the semiconductor substrate 40. The gate spacers 68 may be formed by conformally depositing one or more layers for the gate spacers 68 and anisotropically etching the one or more layers, for example. The one or more layers for the gate spacers 68 may include or be silicon nitride, silicon oxynitride, silicon carbon nitride, the like, multi-layers thereof, or a combination thereof.

Source/drain regions 70 are formed in the fins 60 on opposing sides of the respective dummy gate stack. In some examples, the source/drain regions 70 are formed by implanting a conductivity dopant species into the fins 60 using the dummy gate stacks and gate spacers 68 as masks. Hence, source/drain regions 70 can be formed by implantation on opposing sides of the dummy gate stacks. In other examples, the fins 60 may be recessed using the dummy gate stacks and gate spacers 68 as masks, and epitaxial source/drain regions 70 may be epitaxially grown in the recesses. The recessing can be performed by an etching process. The etching process can be isotropic or anisotropic, or further, may be selective with respect to one or more crystalline planes of the semiconductor substrate 40. Hence, the recesses can have various cross-sectional profiles based on the etching process implemented. The epitaxial source/drain regions 70 may include or be silicon germanium, silicon carbide, silicon phosphorus, pure or substantially pure germanium, a III-V compound semiconductor, a II-VI compound semiconductor, or the like. Epitaxial source/drain regions 70 may be raised in relation to the fins 60, as illustrated. The epitaxial source/drain regions 70 may be doped by in situ doping during the epitaxial growth and/or by implantation after the epitaxial growth. Hence, source/drain regions 70 can be formed by epitaxial growth, and possibly with implantation, on opposing sides of the respective dummy gate stacks. Example conductivity dopant species for source/drain regions 70 (e.g., by in situ doping or implantation) can include or be, for example, boron for a p-type device and phosphorus or arsenic for an n-type device, although other conductivity dopant species may be used.

The CESL 72 is then conformally deposited over the fins 60 (including the source/drain regions 70), along the gate spacers 68, and over the dummy gate stacks. Generally, an etch stop layer can provide a mechanism to stop an etching process when forming, e.g., contacts or vias, such as by having a different etch selectivity from adjoining layers or components. The CESL 72 may comprise or be silicon nitride, silicon carbon nitride, silicon carbon oxide, carbon nitride, the like, or a combination thereof.

The first ILD 74 is deposited over the CESL 72. The first ILD 74 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof.

Figure 7:
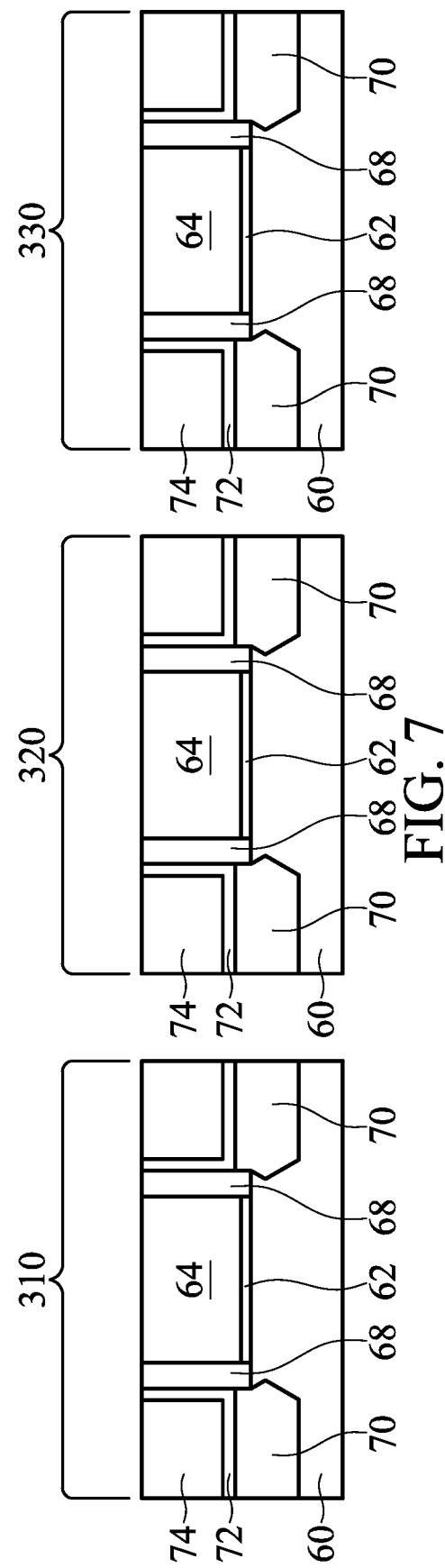

FIG. 7 illustrates the planarization of the first ILD 74 and CESL 72 to expose the dummy gates 64. The first ILD 74 and CESL 72 can be planarized using a CMP, for example. The top surfaces of the first ILD 74 and CESL 72 are planarized to be coplanar with the top surface of the dummy gate 64 to thereby expose the dummy gate 64. The planarization may remove the mask 66 of the dummy gate stack (and, in some instances, upper portions of the gate spacers 68).

Figure 8:
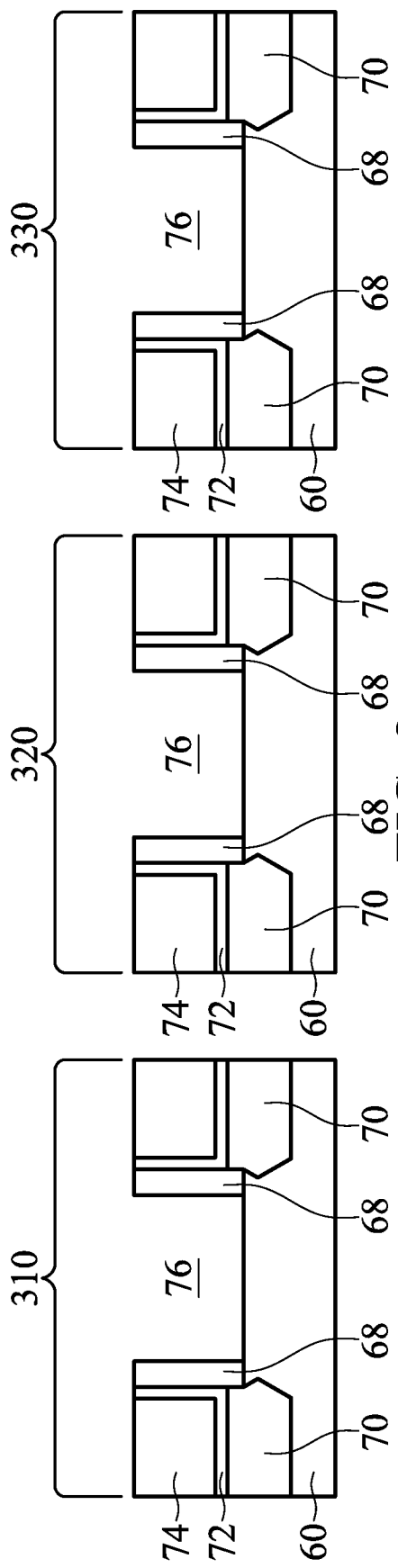

FIG. 8 illustrates the removal of the dummy gate stacks, which forms trenches 76 between the respective gate spacers 68. Once exposed through the first ILD 74 and CESL 72, the dummy gate 64 and interfacial dielectric 62 of the dummy gate stack are removed, such as by one or more etching processes. The dummy gate 64 may be removed by an etching process selective to the dummy gate 64, wherein the interfacial dielectric 62 can act as an etch stop layer, and subsequently, the interfacial dielectric 62 can be removed by a different etching process selective to the interfacial dielectric 62.

Figure 9:
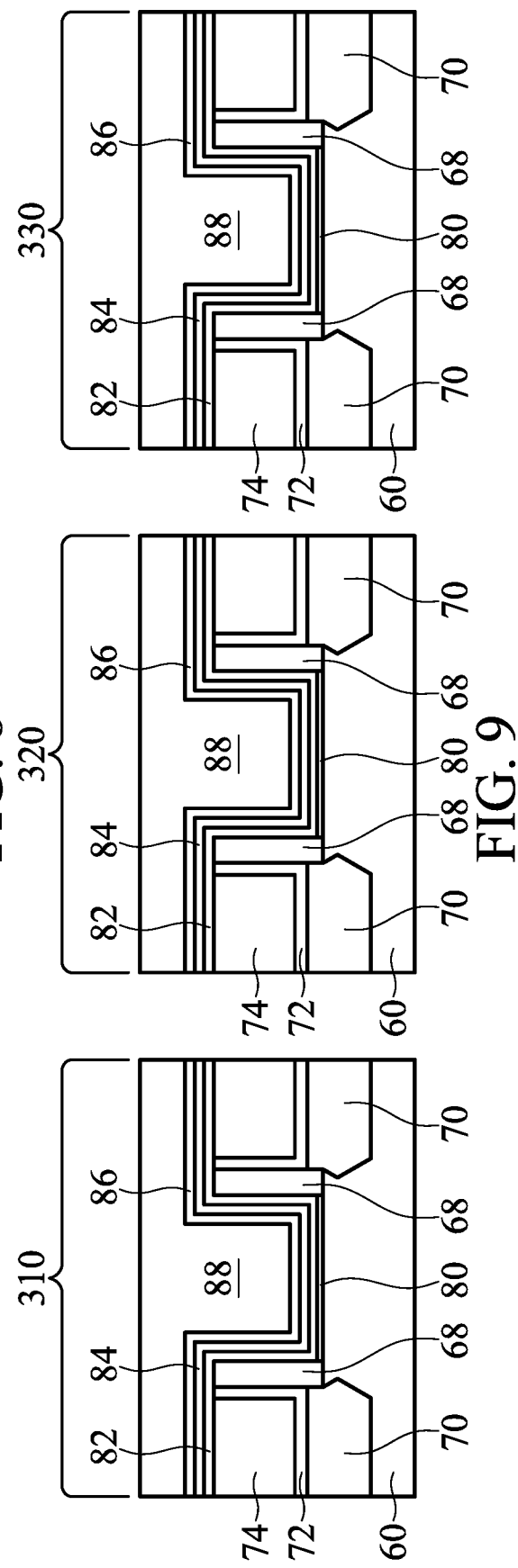

FIG. 9 illustrates the formation of, among others, a gate dielectric layer 82 and a first dipole layer 84 in the trenches 76 in the device regions 310, 320, 330. In some examples, such as illustrated, an interfacial dielectric 80 is formed on the fins 60 exposed through the trenches 76 and between the gate spacers 68. The interfacial dielectric 80 can be, for example, an oxide formed by thermal or chemical oxidation. In some examples, the interfacial dielectric 62 of the dummy gate stack can remain and be in the place of the interfacial dielectric 80. In further examples, the interfacial dielectric 80 may result from various processing steps, such as being a native oxide formed as a result of a cleaning process. In other examples, the interfacial dielectric 80 may be omitted.

The gate dielectric layer 82 is conformally deposited in the trenches 76 in the device regions 310, 320, 330, as also shown in operation 402 of FIG. 16. For example, the gate dielectric layer 82 is deposited over the interfacial dielectric 80, along sidewalls of the gate spacers 68, and over top surfaces of the gate spacers 68, CESL 72, and first ILD 74. The gate dielectric layer 82 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), or a combination thereof. The gate dielectric layer 82 can be deposited by atomic layer deposition (ALD), plasma enhanced chemical vapor deposition (PECVD), molecular beam deposition (MBD), or another deposition technique. The gate dielectric layer 82 can have a thickness in a range from about 3 Å to about 1000 Å.

The first dipole layer 84 is conformally deposited on the gate dielectric layer 82 in the device regions 310, 320, 330, as also shown in operation 404 of FIG. 16. The first dipole layer 84 may include or be lanthanum (La), aluminum (Al), scandium (Sc), ruthenium (Ru), zirconium (Zr), erbium (Er), magnesium (Mg), strontium (Sr), the like, or a combination thereof; an oxide thereof; a nitride thereof; a carbide thereof; and/or a combination thereof. The first dipole layer 84 may be deposited by ALD, PECVD, MBD, or another deposition technique. The first dipole layer 84 can have a thickness in a range from about 0.1 Å to about 1000 Å.

Optionally, a hardmask 86 is conformally deposited on the first dipole layer 84. The hardmask 86 may include or be a metal oxide (e.g., titanium oxide ($TiO_2$), aluminum oxide ($Al_2O_3$), etc.), a metal nitride (e.g., titanium nitride (TiN), tantalum nitride (TaN), etc.), a metal carbide, silicon nitride, silicon oxynitride, the like, or a combination thereof. The hardmask 86 may be deposited by ALD, PECVD, MBD, or another deposition technique. The hardmask 86 can have a thickness in a range from about 5 Å to about 1000 Å. A photoresist (PR) and bottom anti-reflective coating (BARC) stack (hereinafter, "PR/BARC") 88 is formed over the hardmask 86, if implemented, and/or the first dipole layer 84. The PR/BARC 88 fills the trenches 76 and is formed to cover the device regions 310, 320, 330 of the semiconductor substrate 40.

FIG. 10 illustrates the removal of the first dipole layer 84 from the second device region 320, as also shown in operation 406 of FIG. 16. Using appropriate photolithography and etching processes, the PR/BARC 88 and hardmask 86 are removed from the trench 76 in the second device region 320. Thereafter, the first dipole layer 84 is removed from the trench 76 in the second device region 320 using an appropriate etching process. The etching processes may be a dry etch or a wet etch process, such as a reactive ion etch (RIE), neutral beam etch (NBE), the like, or a combination thereof.

Thereafter, the PR/BARC 88 and hardmask 86 are removed from the first device region 310 and the third device region 330, such as by appropriate etching processes selective to the material of the PR/BARC 88 and hardmask 86. The first dipole layer 84 remains in the trenches 76 in the first device region 310 and the third device region 330 after the PR/BARC 88 and hardmask 86 are removed from the first device region 310 and the third device region 330.

FIG. 11 illustrates the formation of, among others, a second dipole layer 90 in the trenches 76 in the device regions 310, 320, 330. The second dipole layer 90 is conformally deposited on the first dipole layer 84 in the first device region 310 and the third device region 330 and on the gate dielectric layer 82 in the second device region 320, as also shown in operation 408 of FIG. 16. The second dipole layer 90 may include or be lanthanum (La), aluminum (Al), scandium (Sc), ruthenium (Ru), zirconium (Zr), erbium (Er), magnesium (Mg), strontium (Sr), the like, or a combination thereof; an oxide thereof; a nitride thereof; a carbide thereof; and/or a combination thereof. The second dipole layer 90 may be or include a material different from or the same as the first dipole layer 84. The second dipole layer 90 may be deposited by ALD, PECVD, MBD, or another deposition technique. The second dipole layer 90 can have a thickness in a range from about 0.1 Å to about 1000 Å.

Optionally, a hardmask 92 is conformally deposited on the second dipole layer 90. The hardmask 92 may include or be a metal oxide (e.g., titanium oxide ($TiO_2$), aluminum oxide ($Al_2O_3$), etc.), a metal nitride (e.g., titanium nitride (TiN), tantalum nitride (TaN), etc.), a metal carbide, silicon nitride, silicon oxynitride, the like, or a combination thereof. The hardmask 92 may be deposited by ALD, PECVD, MBD, or another deposition technique. The hardmask 92 can have a thickness in a range from about 5 Å to about 1000 Å. A PR/BARC 94 is formed over the hardmask 92, if implemented, and/or the second dipole layer 90. The PR/BARC 94 fills the trenches 76 and is formed to cover the device regions 310, 320, 330 of the semiconductor substrate 40.

FIG. 12 illustrates the removal of the second dipole layer 90 and the first dipole layer 84 from the third device region 330, as also shown in operation 410 of FIG. 16. Using appropriate photolithography and etching processes, the PR/BARC 94 and hardmask 92 are removed from the trench 76 in the third device region 330. Thereafter, the second dipole layer 90 and the first dipole layer 84 are removed from the trench 76 in the third device region 330 using an appropriate etching process. The etching processes may be a dry etch or a wet etch process, such as a RIE, NBE, the like, or a combination thereof.

Thereafter, the PR/BARC 94 and hardmask 92 are removed from the first device region 310 and the second device region 320, such as by appropriate etching processes selective to the material of the PR/BARC 94 and hardmask 92. After the PR/BARC 94 and hardmask 92 are removed from the first device region 310 and the second device region 320, the second dipole layer 90 and the first dipole layer 84 remain in the trench 76 in the first device region 310, and the second dipole layer 90 remains in the trench 76 in the second device region 320, as shown in FIG. 13.

The intermediate structure illustrated in FIG. 13 is then annealed to drive (e.g., diffuse) a dipole dopant species from the dipole layers 84, 90 into the gate dielectric layer 82, as also shown in operation 412 of FIG. 16. In some examples, the anneal can be a rapid thermal anneal or another thermal process, which may be at a temperature in a range from about 400° C. to about 1,100° C. The anneal can have a temperature and/or duration sufficient to drive (e.g., diffuse) one or more dipole dopant species into the gate dielectric layer 82 to a desired dipole dopant concentration. One or more dipole dopant species is driven from the first dipole layer 84 and/or second dipole layer 90 into the gate dielectric layer 82 in the first device region 310. One or more dipole dopant species is driven from the second dipole layer 90 into the gate dielectric layer 82 in the second device region 320. Since no separate dipole layer is in the third device region 330 during the anneal, no dipole dopant species is driven from a dipole layer into the gate dielectric layer 82 in the third device region 330 during the anneal.

As a result of the dipole dopant species being driven into the gate dielectric layer 82, as shown in FIG. 14, a highly-doped dipole dopant species gate dielectric layer 100 is formed in the trench 76 in the first device region 310; a lightly-doped dipole dopant species gate dielectric layer 102 is formed in the trench 76 in the second device region 320; and a dipole dopant species free gate dielectric layer 104 is formed in the trench 76 in the third device region 330. A higher dipole dopant concentration of a dipole dopant species may be driven into the gate dielectric layer 82 in the first device region 310 than into the gate dielectric layer 82 in the second device region 320 because a dipole dopant source in the first device region 310 (e.g., the first dipole layer 84 and/or second dipole layer 90) is different from a dipole dopant source in the second device region 320 (e.g., the second dipole layer 90). For example, the presence of the first dipole layer 84 (e.g., alone or with the second dipole layer 90) in the first device region 310 can be a source of more of a dipole dopant species than the second dipole layer 90 in the second device region 320. After the anneal, a dipole dopant concentration in the highly-doped dipole dopant species gate dielectric layer 100 in the first device region 310 can be in a range from about $1\times10^{12}$ cm$^{-3}$ to about $1\times10^{22}$ cm$^{-3}$; a dipole dopant concentration in the lightly-doped dipole dopant species gate dielectric layer 102 in the second device region 320 can be in a range from about $1\times10^{12}$ cm$^{-3}$ to about $1\times10^{22}$ cm$^{-3}$; and a dipole dopant concentration in the dipole dopant species free gate dielectric layer 104 in the third device region 330 can be equal to or less than about $1\times10^{13}$ cm$^{-3}$. It is worth noting that the terms "highly-doped" and "lightly-doped" do not necessarily connote any specific concentration or range of concentrations.

FIG. 14 further illustrates the removal of the first dipole layer 84 and second dipole layer 90, as also shown in operation 414 of FIG. 16, and the formation of one or more optional conformal layers 106 and a gate conductive fill material 108, as also shown in operation 416 of FIG. 16. The first dipole layer 84 and second dipole layer 90 can be removed from the first device region 310 and the second device region 320 using one or more etching processes selective to the material of the first dipole layer 84 and second dipole layer 90. The etching processes can include a wet etching process or a dry etching process, such as a RIE, NBE, or the like, and/or a wet etching process.

Then, the one or more optional conformal layers 106 can be conformally (and sequentially, if more than one) deposited on the highly-doped dipole dopant species gate dielectric layer 100 in the first device region 310, the lightly-doped dipole dopant species gate dielectric layer 102 in the second device region 320, and the dipole dopant species free gate dielectric layer 104 in the third device region 330. The one or more optional conformal layers 106 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof. The gate conductive fill material 108 is formed over the one or more optional conformal layers 106, if implemented, and/or the gate dielectric layers 100, 102, 104. The gate conductive fill material 108 can fill remaining trenches 76 where the dummy gate stacks were removed. The gate conductive fill material 108 may be or comprise a metal-containing material such as tungsten, cobalt, aluminum, ruthenium, copper, multi-layers thereof, a combination thereof, or the like. The one or more optional conformal layers 106 and gate conductive fill material 108 can be deposited by any appropriate deposition technique.

In some examples, the same work-function tuning layers and gate conductive fill material 108 are formed in the trenches 76 on the gate dielectric layers 100, 102, 104. In other examples, different work-function tuning layers and/or gate conductive fill material 108 (e.g., with different materials) are formed in the trenches 76 on the gate dielectric layers 100, 102, 104 to further tune threshold voltages of the respective transistor devices. In further examples, one or more work-function tuning layers may be formed in trenches 76 on some of the gate dielectric layers 100, 102, 104, while no work-function tuning layer is formed in trenches 76 on one or more others of the gate dielectric layers 100, 102, 104. In still further examples, no work-function tuning layer is formed in trenches 76 on any of the gate dielectric layers 100, 102, 104.

FIG. 15 illustrates the removal of excess gate conductive fill material 108, one or more optional conformal layers 106, and gate dielectric layers 100, 102, 104, and the formation of a second ILD 110. A CMP may remove excess gate conductive fill material 108, one or more optional conformal layers 106, and gate dielectric layers 100, 102, 104 above the top surface of the first ILD 74, etc. The replacement gate structures comprising respective gates (e.g., the gate conductive fill material 108 and one or more optional conformal layers 106), gate dielectric layers 100, 102, 104, and interfacial dielectrics 80 may therefore be formed as illustrated in FIG. 15.

The second ILD 110 is formed over the first ILD 74, CESL 72, gate spacers 68, and replacement gate structures. The second ILD 110 may comprise or be silicon dioxide, a low-k dielectric material, such as silicon oxynitride, PSG, BSG, BPSG, USG, FSG, OSG, SiO$_x$C$_y$, Spin-On-Glass, Spin-On-Polymers, silicon carbon material, a compound thereof, a composite thereof, the like, or a combination thereof. The second ILD 110 may be deposited by any appropriate deposition technique.

FIGS. 17 through 23 illustrate cross-sectional views of intermediate structures at respective stages during another example method for forming a semiconductor device in accordance with some embodiments. More specifically, FIGS. 17 through 23 illustrate a method for forming replacement gate structures in different device regions, where the replacement gate structures of the different device regions can include gate dielectric layers having varying levels of a dipole dopant species to tune threshold voltages, for example. FIG. 24 is a flow chart of some operations of the example method for forming a semiconductor device in FIGS. 17 through 23 in accordance with some embodiments.

Processing proceeds as described above with respect to FIGS. 6 through 8 and then continues to processing as described below with respect to FIG. 17.

FIG. 17 illustrates the formation of, among others, a gate dielectric layer 82 and a first blocking layer 120 in the trenches 76 in the device regions 310, 320, 330. In some examples, such as illustrated, an interfacial dielectric 80 can be on the fins 60 exposed through the trenches 76 and between the gate spacers 68, as previously described with respect to FIG. 9. The gate dielectric layer 82 is conformally deposited in the trenches 76 in the device regions 310, 320, 330, as also shown in operation 502 of FIG. 24. For example, the gate dielectric layer 82 is deposited over the interfacial dielectric 80, along sidewalls of the gate spacers 68, and over top surfaces of the gate spacers 68, CESL 72, and first ILD 74. The gate dielectric layer 82 can be or include materials and be deposited as described above with respect to FIG. 9. The gate dielectric layer 82 can have a thickness in a range from about 3 Å to about 1000 Å.

The first blocking layer 120 is conformally deposited on the gate dielectric layer 82 in the device regions 310, 320, 330, as also shown in operation 504 of FIG. 24. The first blocking layer 120 may include or be a metal nitride (e.g., TiN or TaN), a metal oxide, silicon oxide, silicon nitride, the like, or a combination thereof. The first blocking layer 120 may be deposited by ALD, PECVD, MBD, or another deposition technique. The first blocking layer 120 can have a thickness in a range from about 5 Å to about 1000 Å.

Optionally, a hardmask 122 is conformally deposited on the first blocking layer 120. The hardmask 122 may include or be a metal oxide (e.g., titanium oxide (TiO$_2$), aluminum oxide (Al$_2$O$_3$), etc.), a metal nitride (e.g., titanium nitride (TiN), tantalum nitride (TaN), etc.), a metal carbide, silicon nitride, silicon oxynitride, the like, or a combination thereof. The hardmask 122 may be deposited by ALD, PECVD, MBD, or another deposition technique. The hardmask 122 can have a thickness in a range from about 5 Å to about 1000 Å. A PR/BARC 124 is formed over the hardmask 122, if implemented, and/or the first blocking layer 120. The PR/BARC 124 fills the trenches 76 and is formed to cover the device regions 310, 320, 330 of the semiconductor substrate 40.

FIG. 18 illustrates the removal of the first blocking layer 120 from the second device region 320, as also shown in operation 506 of FIG. 24. Using appropriate photolithography and etching processes, the PR/BARC 124 and hardmask 122 are removed from the trench 76 in the second device region 320. Thereafter, the first blocking layer 120 is removed from the trench 76 in the second device region 320 using an appropriate etching process. The etching processes may be a dry etch or a wet etch process, such as RIE, NBE, the like, or a combination thereof.

Thereafter, the PR/BARC 124 and hardmask 122 are removed from the first device region 310 and the third device region 330, such as by appropriate etching processes selective to the material of the PR/BARC 124 and hardmask 122. The first blocking layer 120 remains in the trenches 76 in the first device region 310 and the third device region 330 after the PR/BARC 124 and hardmask 122 are removed from the first device region 310 and the third device region 330.

FIG. 19 illustrates the formation of, among others, a second blocking layer 132 in the trenches 76 in the device regions 310, 320, 330. The second blocking layer 132 is conformally deposited on the first blocking layer 120 in the first device region 310 and the third device region 330 and on the gate dielectric layer 82 in the second device region 320, as also shown in operation 508 of FIG. 24. The second blocking layer 132 may include or be a metal nitride (e.g., TiN or TaN), a metal oxide, silicon oxide, silicon nitride, the like, or a combination thereof. The second blocking layer 132 may be or include a material different from or the same as the first blocking layer 120. The second blocking layer 132 may be deposited by ALD, PECVD, MBD, or another deposition technique. The second blocking layer 132 can have a thickness in a range from about 5 Å to about 1000 Å.

Optionally, a hardmask 134 is conformally deposited on the second blocking layer 132. The hardmask 134 may include or be a metal oxide (e.g., titanium oxide (TiO$_2$), aluminum oxide (Al$_2$O$_3$), etc.), a metal nitride (e.g., titanium nitride (TiN), tantalum nitride (TaN), etc.), a metal carbide, silicon nitride, silicon oxynitride, the like, or a combination thereof. The hardmask 134 may be deposited by ALD, PECVD, MBD, or another deposition technique. The hardmask 134 can have a thickness in a range from about 5 Å to about 1000 Å. A PR/BARC 136 is formed over the hardmask 134, if implemented, and/or the second blocking layer 132. The PR/BARC 136 fills the trenches 76 and is formed to cover the device regions 310, 320, 330 of the semiconductor substrate 40.

FIG. 20 illustrates the removal of the second blocking layer 132 and the first blocking layer 120 from the first device region 310, as also shown in operation 510 of FIG. 24. Using appropriate photolithography and etching processes, the PR/BARO 136 and hardmask 134 are removed from the trench 76 in the first device region 310. Thereafter, the second blocking layer 132 and the first blocking layer 120 are removed from the trench 76 in the first device region 310 using an appropriate etching process. The etching processes may be a dry etch or a wet etch process, such as RIE, NBE, the like, or a combination thereof.

Thereafter, the PR/BARC 136 and hardmask 134 are removed from the second device region 320 and the third device region 330, such as by appropriate etching processes selective to the material of the PR/BARC 136 and hardmask 134. After the PR/BARC 136 and hardmask 134 are removed from the second device region 320 and the third device region 330, the second blocking layer 132 remains in the trench 76 in the second device region 320, and the second blocking layer 132 and the first blocking layer 120 remains in the trench 76 in the third device region 330, as shown in FIG. 21.

Figure 21:
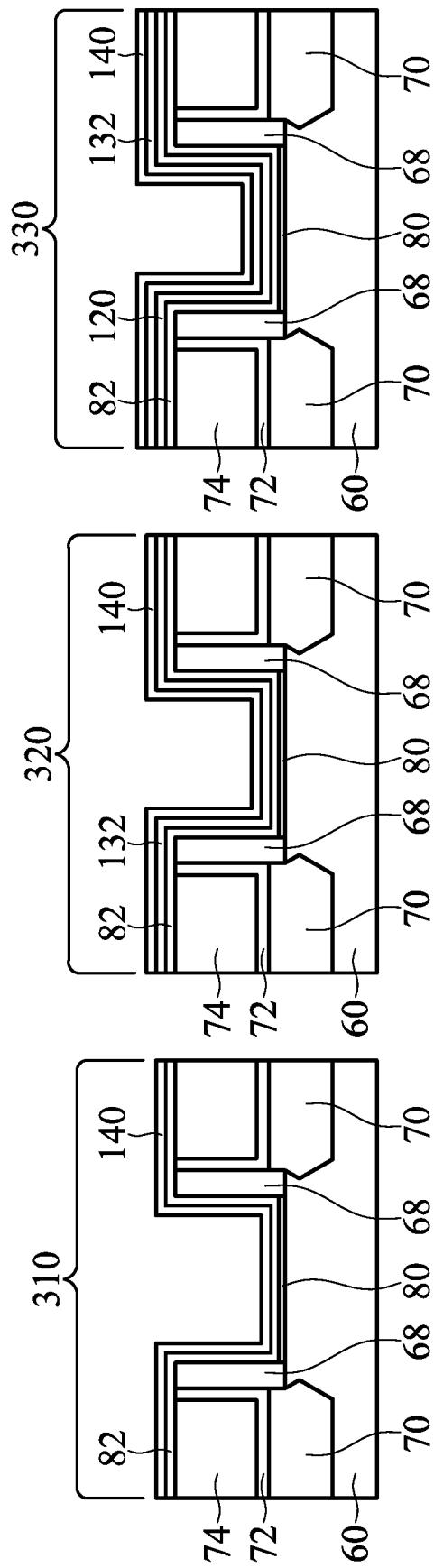

FIG. 21 further illustrates the formation of a dipole layer 140 in the trenches 76 in the device regions 310, 320, 330. The dipole layer 140 is conformally deposited on the gate dielectric layer 82 in the first device region 310 and on the second blocking layer 132 in the second device region 320 and the third device region 330, as also shown in operation 512 of FIG. 24. The dipole layer 140 may include or be lanthanum (La), aluminum (Al), scandium (Sc), ruthenium (Ru), zirconium (Zr), erbium (Er), magnesium (Mg), strontium (Sr), the like, or a combination thereof; an oxide thereof; a nitride thereof; a carbide thereof; and/or a combination thereof. The dipole layer 140 may be deposited by ALD, PECVD, MBD, or another deposition technique. The dipole layer 140 can have a thickness in a range from about 0.1 Å to about 1000 Å.

The intermediate structure illustrated in FIG. 21 is then annealed to drive a dipole dopant species from the dipole layer 140 into the gate dielectric layer 82, as also shown in operation 514 of FIG. 24. The blocking layers 120, 132 can retard or prevent diffusion of a dipole dopant species into the gate dielectric layer 82 in the second device region 320 and the third device region 330. In some examples, the anneal can be a rapid thermal anneal or another thermal process, which may be at a temperature in a range from about 400° C. to about 1,100° C. The anneal can have a temperature and/or duration sufficient to drive (e.g., diffuse) one or more dipole dopant species into the gate dielectric layer 82 to a desired dipole dopant concentration. One or more dipole dopant species is driven from the dipole layer 140 into the gate dielectric layer 82 in the first device region 310. One or more dipole dopant species is driven from the dipole layer 140 through the second blocking layer 132 into the gate dielectric layer 82 in the second device region 320. The blocking layers 120, 132 in the third device region 330 during the anneal may block or minimize a dipole dopant species being driven from the dipole layer 140 into the gate dielectric layer 82 in the third device region 330 during the anneal.

Figure 22:
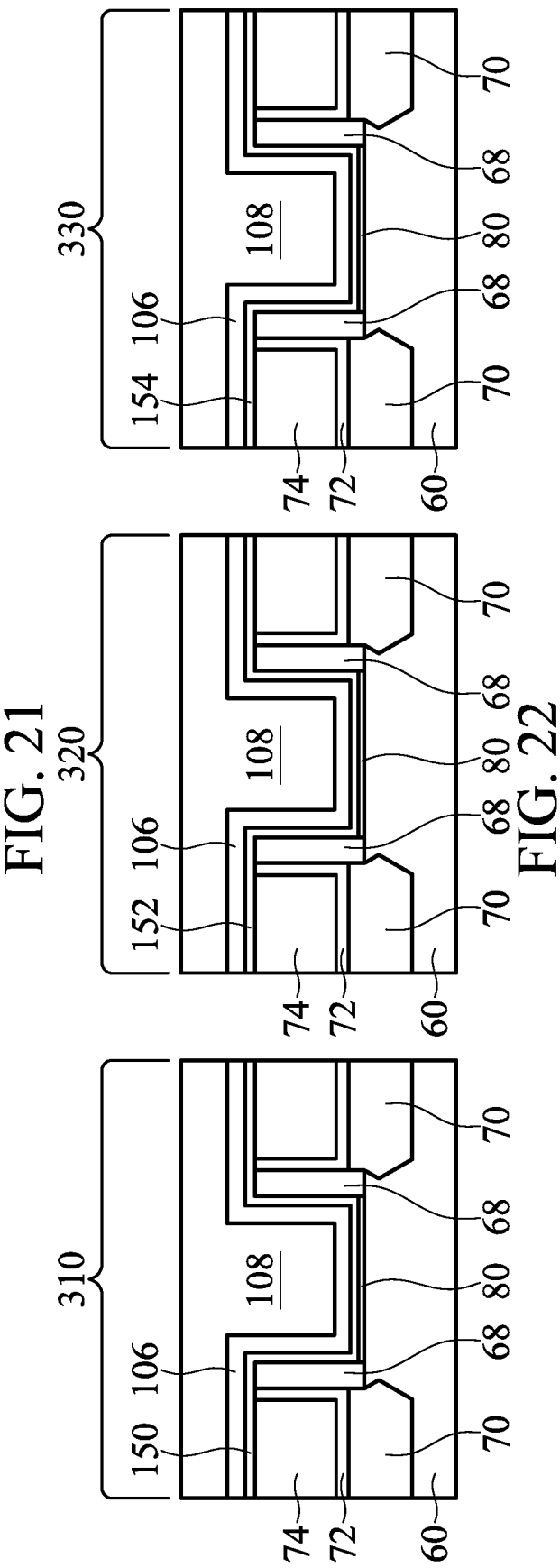

As a result of the dipole dopant species being driven into the gate dielectric layer 82, as shown in FIG. 22, a highly-doped dipole dopant species gate dielectric layer 150 is formed in the trench 76 in the first device region 310; a lightly-doped dipole dopant species gate dielectric layer 152 is formed in the trench 76 in the second device region 320; and a dipole dopant species free gate dielectric layer 154 is formed in the trench 76 in the third device region 330. A higher dipole dopant concentration of a dipole dopant species may be driven into the gate dielectric layer 82 in the first device region 310 than into the gate dielectric layer 82 in the second device region 320 because no blocking layer is disposed between the dipole dopant source (e.g., the dipole layer 140) and the gate dielectric layer 82 in the first device region 310, whereas the second blocking layer 132 is disposed between the dipole dopant source (e.g., the dipole layer 140) and the gate dielectric layer 82 in the second device region 320 to retard diffusion of the dipole dopant species into the gate dielectric layer 82. Similarly, a higher dipole dopant concentration of a dipole dopant species may be driven into the gate dielectric layer 82 in the second device region 320 than into the gate dielectric layer 82 in the third device region 330 because an additional blocking layer (e.g., the first blocking layer 120) is disposed between the dipole dopant source (e.g., the dipole layer 140) and the gate dielectric layer 82 in the third device region 330 compared to the second device region 320.

After the anneal, a dipole dopant concentration in the highly-doped dipole dopant species gate dielectric layer 150 in the first device region 310 can be in a range from about $1 \times 10^{12}$ cm$^{-3}$ to about $1 \times 10^{22}$ cm$^{-3}$; a dipole dopant concentration in the lightly-doped dipole dopant species gate dielectric layer 152 in the second device region 320 can be in a range from about $1 \times 10^{12}$ cm$^{-3}$ to about $1 \times 10^{22}$ cm$^{-3}$; and a dipole dopant concentration in the dipole dopant species free gate dielectric layer 154 in the third device region 330 can be equal to or less than about $1 \times 10^{13}$ cm$^{-3}$.

FIG. 22 further illustrates the removal of the dipole layer 140, first blocking layer 120, and second blocking layer 132 from the device regions 310, 320, 330, as also shown in operation 516 of FIG. 24, and the formation of one or more optional conformal layers 106 and a gate conductive fill material 108, as also shown in operation 518 of FIG. 24. The dipole layer 140, first blocking layer 120, and second blocking layer 132 can be removed from the device regions 310, 320, 330 using one or more etching processes selective to the material of the dipole layer 140, first blocking layer 120, and second blocking layer 132. The etching processes can include a wet etching process or a dry etching process, such as a RIE, NBE, or the like, and/or a wet etching process.

Then, the one or more optional conformal layers 106 can be conformally (and sequentially, if more than one) deposited on the highly-doped dipole dopant species gate dielectric layer 150 in the first device region 310, the lightly-doped dipole dopant species gate dielectric layer 152 in the second device region 320, and the dipole dopant species free gate dielectric layer 154 in the third device region 330. The one or more optional conformal layers 106 and gate conductive fill material 108 can be formed using materials and any appropriate deposition technique as previously described with respect to FIG. 14.

In some examples, the same work-function tuning layers and gate conductive fill material 108 are formed in the trenches 76 on the gate dielectric layers 150, 152, 154. In other examples, different work-function tuning layers and/or gate conductive fill material 108 (e.g., with different materials) are formed in the trenches 76 on the gate dielectric layers 150, 152, 154 to further tune threshold voltages of the respective transistor devices. In further examples, one or more work-function tuning layers may be formed in trenches 76 on some of the gate dielectric layers 150, 152, 154, while no work-function tuning layer is formed in trenches 76 on one or more others of the gate dielectric layers 150, 152, 154. In still further examples, no work-function tuning layer is formed in trenches 76 on any of the gate dielectric layers 150, 152, 154.

Figure 23:
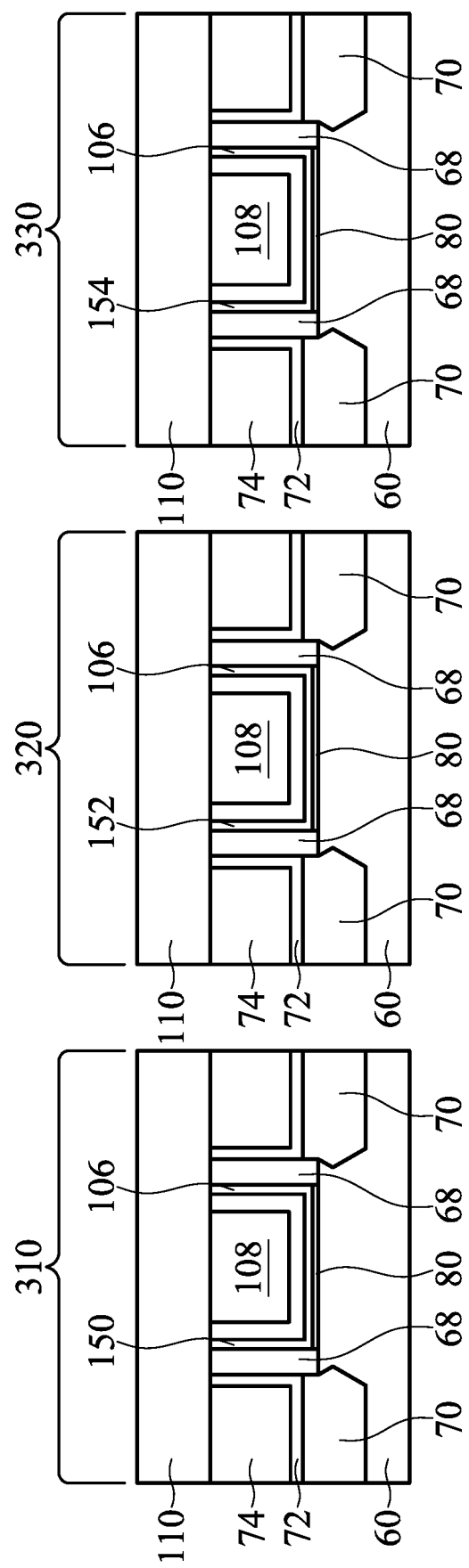
Figure 24:
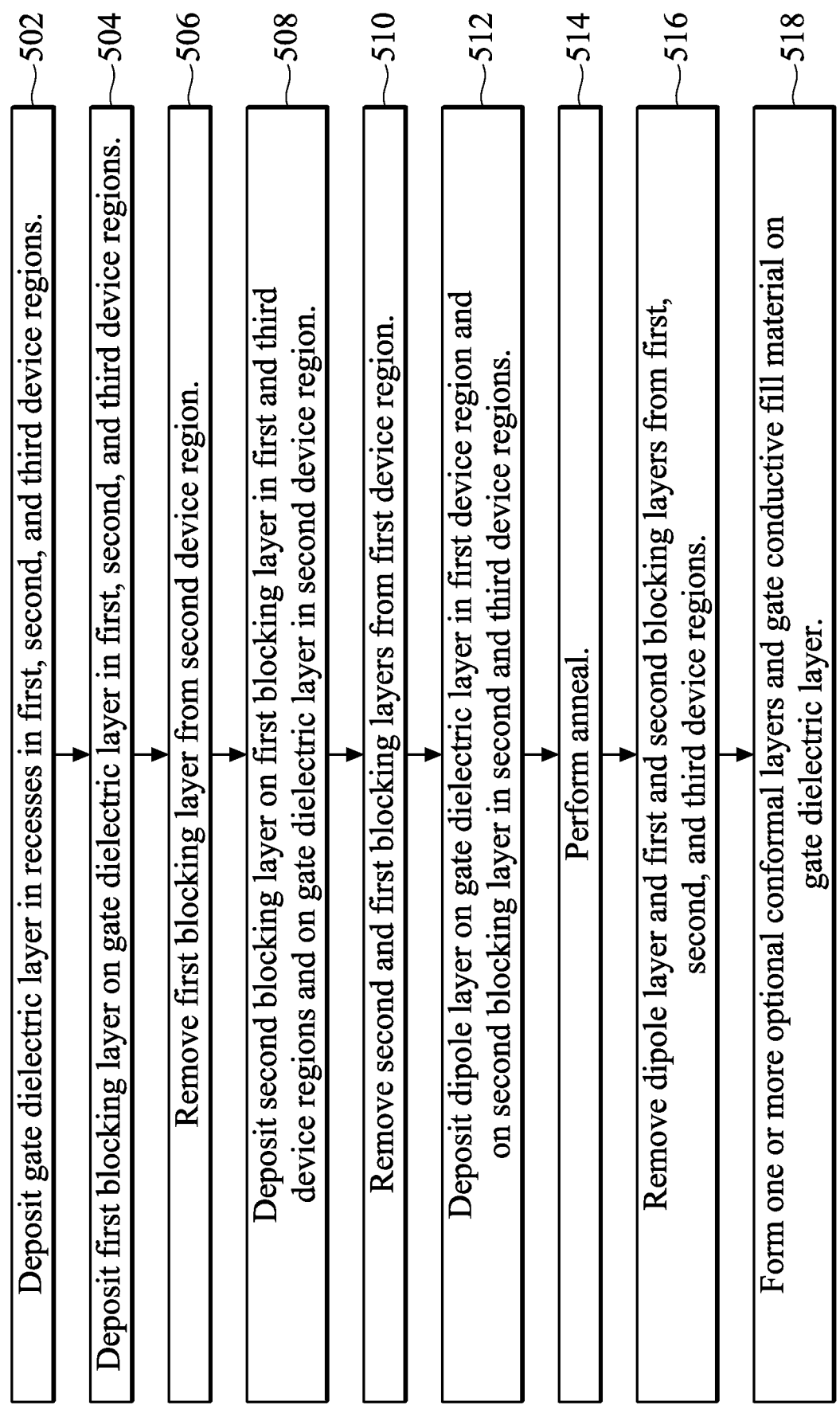
FIG. 24 is a flow chart of some operations of the example method for forming a semiconductor device in FIGS. 17 through 23 in accordance with some embodiments.

FIG. 23 illustrates the removal of excess gate conductive fill material 108, one or more optional conformal layers 106, and gate dielectric layers 150, 152, 154, and the formation of a second ILD 110, as described above with respect to FIG. 15 with corresponding layers.

Figure 25:
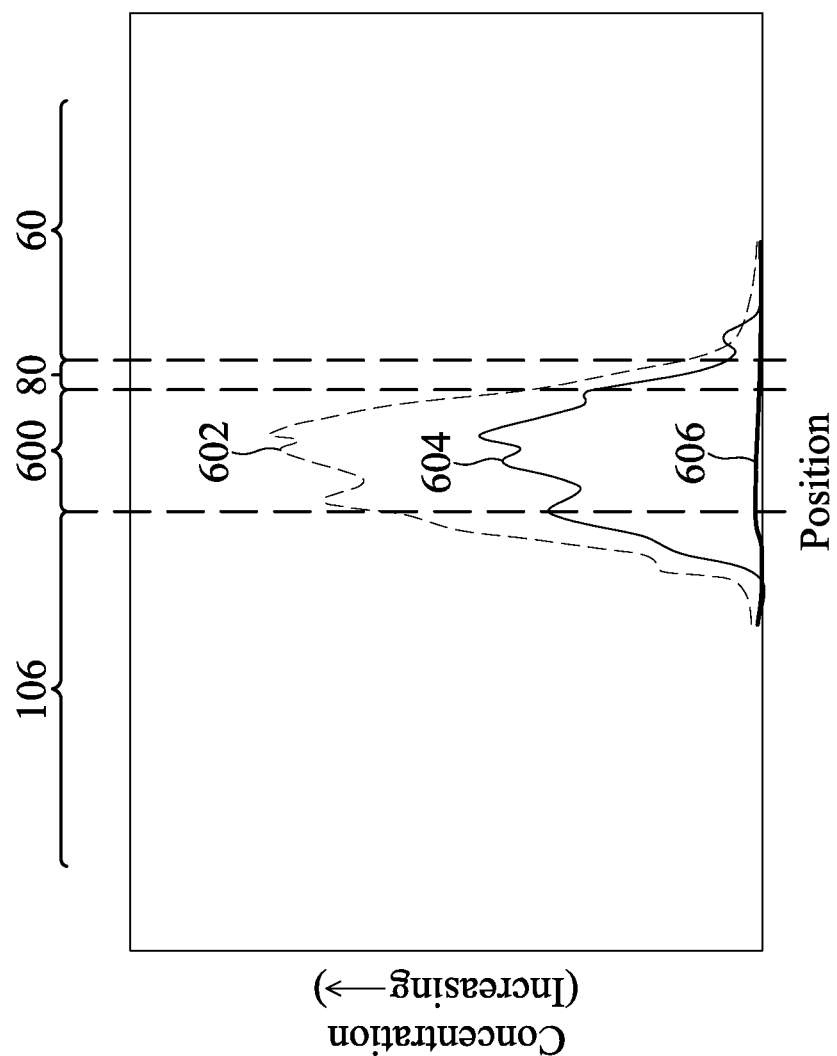
FIG. 25 is a graph depicting general dipole dopant concentrations of dipole dopant species in structures formed by a method described above in accordance with some embodiments.

FIG. 25 is a graph depicting a secondary ion mass spectrometry (SIMS) analysis of dipole dopant species in structures formed by a method described above in accordance with some embodiments. In the examples formed for the SIMS analysis, lanthanum was used as the dipole dopant. The lanthanum dopant formed a lanthanum oxide in the layers that were doped. The graph illustrates a dipole dopant (e.g., lanthanum) concentration as a function of position in the structure. The positions depicted are across the one or more optional conformal layers 106, a gate dielectric layer 600, the interfacial dielectric 80, and the fin 60. The gate dielectric layer 600 is the respective highly-doped dipole dopant species gate dielectric layer 100, 150, lightly-doped dipole dopant species gate dielectric layer 102, 152, and dipole dopant species free gate dielectric layer 104, 154 corresponding to the general dipole dopant concentration. The highly-doped dipole dopant concentration gradient 602 is a general dipole dopant concentration gradient corresponding to the highly-doped dipole dopant species gate dielectric layer 100, 150 in the first device region 310. The lightly-doped dipole dopant concentration gradient 604 is a general dipole dopant concentration gradient corresponding to the lightly-doped dipole dopant species gate dielectric layer 102, 152 in the second device region 320. The dipole dopant free concentration gradient 606 is a general dipole dopant concentration gradient corresponding to the dipole dopant species free gate dielectric layer 104, 154 in the third device region 330.

Each of the dipole dopant concentration gradients 602, 604, 606 can have a peak, and can decrease in a direction from the peak towards the fin 60. These dipole dopant concentration gradients 602, 604, 606 can result from diffusion of the dipole dopant species into the respective gate dielectric layer 600. In a completed structure, the dipole dopant species may further diffuse from the respective gate dielectric layer 600 into the overlying layer (e.g., the one or more optional conformal layers 106) such that some decrease from the peak of the respective dipole dopant concentration gradient 602, 604, 606 to the interface between the overlying layer and the respective gate dielectric layer 600 may occur. In some examples, the peaks of the dipole dopant concentrations can be shifted closer towards or farther away from the interface between the respective gate dielectric layer 600 and the interfacial dielectric 80.

Generally, the highly-doped dipole dopant concentration gradient 602 is greater than the lightly-doped dipole dopant concentration gradient 604, which is greater than the dipole dopant free concentration gradient 606. Some dipole dopant species may be present in the dipole dopant species free gate dielectric layer 104, 154 due to processing occurring before the anneal and/or due to a lack of complete prevention of diffusion of the dipole dopant species by blocking layers; however, such amount of dipole dopant species may be negligible.

Generally, dipole doping according to methods described above can alter or tune the capacitances between the gate and the fin across the gate dielectric layers in the device regions. The altered or tuned capacitances can therefore alter or tune threshold voltages of the transistor devices formed in the device regions because threshold voltage is a function of the capacitance. Hence, by dipole doping at various levels for different transistor devices, the different transistor devices can have different threshold voltages.

Some of the operations described above can be repeated any number of times to create any number of gate dielectric layers with different dipole dopant concentrations. A person having ordinary skill in the art will readily understand how these operations can be repeated to achieve various different dipole dopant concentrations.

Some embodiments can achieve advantages. Aspects of methods described above and the corresponding structures can permit tuning threshold voltages of transistor devices independently from or in addition to the metal layer scheme implemented in the replacement gate structures. Hence, in some examples, threshold voltage can be tuned without sacrificing spacing that would be required for various metal layers in the replacement gate structure to otherwise achieve a similar tuning. Hence, some examples may permit threshold voltage tuning while more easily accommodating a low resistance gate conductive fill material to lower gate resistance. Further, the various aspects described herein can provide for multiple mechanisms to tune threshold voltages of transistor devices. Materials implemented in the substrate (e.g., fin 60), conductivity doping of the substrate (e.g., fin 60), dipole doping in the gate dielectric layer, and/or workfunction tuning layers in the replacement gate structure can be combined in any number of ways to implement any number of threshold voltages on a single substrate. This can permit many different small differences of threshold voltages between different transistor devices, such as 35 mV, for example. Further, according to tests performed by the inventors, dipole doping according to methods described above may not increase time dependent dielectric breakdown (TDDB) of a gate dielectric layer. Additionally, in tests performed by the inventors, the capacitance equivalent thickness (CET) of the gate dielectric layer improved or was not significantly degraded relative to other processing. For example, in some examples, the dipole dopant species free gate dielectric layer 104 or 154 (e.g., a gate dielectric layer without dipole doping) had a CET of 12.49 Å; the lightly-doped dipole dopant species gate dielectric layer 102 or 152 had a CET of 12.76 Å (e.g., an increase of 0.26 Å over the layer without dipole doping); and the highly-doped dipole dopant species gate dielectric layer 100 or 150 had a CET of 12.81 Å (e.g., an increase of 0.32 Å over the layer without dipole doping). Other advantages may be achieved.

An embodiment is a method for semiconductor processing. A gate dielectric layer is deposited over a first active area in a first device region of a substrate. A first dipole layer is deposited over the gate dielectric layer in the first device region. A dipole dopant species is diffused from the first dipole layer into the gate dielectric layer in the first device region.

Another embodiment is a structure. The structure includes a first transistor on a substrate and a second transistor on the substrate. The first transistor includes a first gate dielectric layer over a first active area, and a first gate over the first gate dielectric layer. The second transistor includes a second gate dielectric layer over a second active area, and a second gate over the second gate dielectric layer. The first gate dielectric layer is doped with a dipole dopant species at a first dipole dopant concentration. The second gate dielectric layer is doped with a dipole dopant species at a second dipole dopant concentration. The first dipole dopant concentration is greater than the second dipole dopant concentration.

A further embodiment is a method for semiconductor processing. A gate dielectric layer is formed over a first active area and a second active area. The first active area and the second active area are on a substrate. A first dipole layer is formed over the gate dielectric layer over the first active area. A dipole dopant species is diffused from the first dipole layer into the gate dielectric layer. After diffusing the dipole dopant species from the first dipole layer into the gate dielectric layer, a dipole dopant concentration in the gate dielectric layer over the first active area is greater than a dipole dopant concentration in the gate dielectric layer over the second active area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for semiconductor processing, the method comprising:
   forming a gate dielectric layer over a first active area and a second active area, the first active area and the second active area being on a substrate, wherein the first active area and the second active area have a same conductivity type;

forming a first dipole layer over the gate dielectric layer over the first active area and the second active area;
removing the first dipole layer from the second active area to expose the gate dielectric layer over the second active area;
after removing the first dipole layer from the second active area, forming a second dipole layer directly on the first dipole layer over the first active area and on the gate dielectric layer over the second active area; and
diffusing a first dipole dopant species from the first dipole layer into the gate dielectric layer over the first active area and diffusing a second dipole dopant species from the second dipole layer into the gate dielectric layer over the first active area and the second active area, wherein a dipole dopant concentration of the first dipole dopant species and the second dipole dopant species in the gate dielectric layer over the first active area is greater than a dipole dopant concentration of the second dipole dopant species in the gate dielectric layer over the second active area.

2. The method of claim 1 further comprising:
doping the first active area with a first dopant, the first dopant being a first conductivity type, the first active area having a first dopant concentration of dopants having the first conductivity type; and
doping the second active area with a second dopant, the second dopant being the first conductivity type, the second active area having a second dopant concentration of dopants having the first conductivity type, wherein the first dopant concentration is different than the second dopant concentration.

3. The method of claim 1, wherein the first active area comprises a first semiconductor material, the second active area comprises a second semiconductor material, the first semiconductor material being different than the second semiconductor material.

4. The method of claim 3, wherein the first active area and the second active area has a same dopant concentration of a first conductivity type.

5. The method of claim 1, wherein the first active area and the second active area has a same dopant concentration of a first conductivity type.

6. The method of claim 1 further comprising:
forming the gate dielectric layer over a third active area;
forming the first dipole layer and the second dipole layer over the third active area; and
prior to diffusing, removing the first dipole layer and the second dipole layer from over the third active area.

7. The method of claim 1, wherein the first dipole layer comprises lanthanum, aluminum, scandium, ruthenium, zirconium, erbium, magnesium, or strontium.

8. A method for semiconductor processing, the method comprising:
depositing a gate dielectric layer over a first active area in a first device region of a substrate and a second active area in a second device region of the substrate;
depositing a first blocking layer over the gate dielectric layer in the first device region and the second device region;
removing the first blocking layer from the first device region to expose the gate dielectric layer in the first device region, wherein the gate dielectric layer in the second device region remains covered by the first blocking layer;
depositing a first dipole layer directly on the gate dielectric layer in the first device region, wherein the first blocking layer separates the first dipole layer from the gate dielectric layer in the second device region; and
diffusing a dipole dopant species from the first dipole layer into the gate dielectric layer in the first device region and diffusing the dipole dopant species from the first dipole layer into the gate dielectric layer in the second device region, wherein a concentration of the dipole dopant species in the gate dielectric layer in the first device region is greater than a concentration of the dipole dopant species in the gate dielectric layer in the second device region.

9. The method of claim 8 further comprising:
after diffusing, removing the first dipole layer from the first device region and the second device region.

10. The method of claim 9 further comprising:
after removing the first dipole layer, removing the first blocking layer from the second device region.

11. The method of claim 8, wherein the first active area and the second active area comprises different material compositions.

12. The method of claim 8, wherein the first active area and the second active area are a same conductivity type.

13. The method of claim 8, wherein diffusing the dipole dopant species from the first dipole layer into the gate dielectric layer includes annealing the first dipole layer.

14. The method of claim 8 further comprising, prior to diffusing:
forming the gate dielectric layer over a third active area of a third device region;
forming the first blocking layer on the gate dielectric layer in the third device region;
forming a second blocking layer on the first blocking layer in the third device region; and
forming the first dipole layer on the second blocking layer in the third device region, wherein first blocking layer and the second blocking layer remain during the diffusing, wherein after diffusing, the gate dielectric layer in third device region has fewer dipole dopant species than the gate dielectric layer in the first device region and the second device region.

15. The method of claim 8, wherein the first dipole layer comprises lanthanum, aluminum, scandium, ruthenium, zirconium, erbium, magnesium, or strontium.

16. A structure comprising:
a first transistor on a substrate, the first transistor comprising:
a first gate dielectric layer over a first channel region in a first active area, the first gate dielectric layer being doped with a dipole dopant species at a first dipole dopant concentration; and
a first gate over the first gate dielectric layer; and
a second transistor on the substrate, the second transistor comprising:
a second gate dielectric layer over a second channel region in a second active area, the second gate dielectric layer being doped with a dipole dopant species at a second dipole dopant concentration, the first dipole dopant concentration being greater than the second dipole dopant concentration, wherein the first channel region is a different material from the second channel region; and
a second gate over the second gate dielectric layer.

17. The structure of claim 16, wherein the first channel region is doped with a first conductivity dopant species at a first conductivity dopant concentration, wherein the second channel region being doped with a second conductivity dopant species at a second conductivity dopant concentration, wherein the first conductivity dopant concentration is different from the second conductivity dopant concentration.

18. The structure of claim 16, wherein the first transistor and the second transistor are a same conductivity type device.

19. The structure of claim 16, wherein the first channel region comprises a different semiconductor material than the second channel region.

20. The structure of claim 16 further comprising:
- a third transistor on the substrate, the third transistor comprising:
  - a third gate dielectric layer over a third channel region in a third active area, the third gate dielectric layer being doped fewer dipole dopant species than the first gate dielectric layer and the second gate dielectric layer; and
  - a third gate over the third gate dielectric layer.

* * * * *